(12) United States Patent
Lee et al.

(10) Patent No.: US 10,333,013 B2
(45) Date of Patent: Jun. 25, 2019

(54) SEMICONDUCTOR NANOWIRE PHOTOELECTRIC DEVICE

(71) Applicant: KOREA UNIVERSITY RESEARCH AND BUSINESS FOUNDATION, Seoul (KR)

(72) Inventors: Hu-Cheol Lee, Daejeon (KR); Hong-Gyu Park, Seoul (KR); Min-Soo Hwang, Seoul (KR); Jungkil Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/961,218

(22) Filed: Apr. 24, 2018

(65) Prior Publication Data

US 2019/0131469 A1  May 2, 2019

(30) Foreign Application Priority Data

Oct. 27, 2017 (KR) .................. 10-2017-0141198

(51) Int. Cl.
*H01L 31/112* (2006.01)
*H01L 31/028* (2006.01)
(Continued)

(52) U.S. Cl.
CPC .. *H01L 31/0284* (2013.01); *H01L 31/035227* (2013.01); *H01L 31/1129* (2013.01); *H01L 31/1804* (2013.01); *H01L 31/10* (2013.01)

(58) Field of Classification Search
None
See application file for complete search history.

(56) References Cited

U.S. PATENT DOCUMENTS

| 7,211,143 B2 | 5/2007 | Yang et al. |
| 7,666,708 B2 | 2/2010 | Lieber et al. |

(Continued)

FOREIGN PATENT DOCUMENTS

| JP | 2007-515299 A | 6/2007 |
| KR | 10-2009-0064908 A | 6/2009 |

(Continued)

OTHER PUBLICATIONS

Han et al., "Metal-assisted chemical etching of silicon and nanotechnology applications," Nano Today, vol. 9, pp. 271-304 (2014).
(Continued)

*Primary Examiner* — Minh Loan Tran
(74) *Attorney, Agent, or Firm* — Jenkins, Wilson, Taylor & Hunt, P.A.

(57) ABSTRACT

A photoelectric semiconductor nanowire device and a method for manufacturing the same. The photoelectric semiconductor nanowire device includes a semiconductor nanowire doped with a dopant of a first conductivity type and including crystal semiconductor segments which include at least one porous semiconductor segment and are connected to opposite ends of the porous semiconductor segment. A first electrode and a second electrode respectively are disposed in the crystal semiconductor segments around the porous semiconductor segment to provide an electrical connection. The crystal semiconductor segment includes a crystal semiconductor, and the porous semiconductor segment includes a porous semiconductor. The semiconductor nanowire provides a current according to the intensity of an external light when the external light is irradiated to the porous semiconductor segment.

16 Claims, 30 Drawing Sheets

(51) Int. Cl.
      *H01L 31/18*     (2006.01)
      *H01L 31/0352*   (2006.01)
      *H01L 31/10*     (2006.01)

(56) References Cited

U.S. PATENT DOCUMENTS

| | | | |
|---|---|---|---|
| 8,735,797 B2 * | 5/2014 | Yu | B82Y 15/00 250/214.1 |
| 9,181,091 B2 | 11/2015 | Lee et al. | |
| 2007/0032023 A1 | 2/2007 | Lieber et al. | |
| 2011/0133160 A1 * | 6/2011 | Yu | H01L 27/14607 257/14 |
| 2012/0153250 A1 * | 6/2012 | Modawar | H01L 31/035227 257/9 |
| 2017/0186895 A1 * | 6/2017 | Jung | H01L 27/0248 |

FOREIGN PATENT DOCUMENTS

| | | | |
|---|---|---|---|
| KR | 10-0949081 B1 | 3/2010 |
| KR | 10-2011-0064703 A | 6/2011 |
| KR | 101313176 | 9/2013 |
| KR | 10-1636907 B1 | 7/2016 |

OTHER PUBLICATIONS

Ghosh et al., "Silicon nanowire heterostructures: growth strategies, novel properties, and emerging applications," Science Advances Today, vol. 2, pp. 1-21 (2016).

* cited by examiner (a)

(b)

SEMICONDUCTOR NANOWIRE PHOTOELECTRIC DEVICE

CROSS-REFERENCE TO RELATED APPLICATIONS

This U.S. non-provisional patent application claims priority under 35 U.S.C. § 119 to Korean Patent Application No. 10-2017-0141198, filed on Oct. 27, 2017, in the Korean Intellectual Property Office, the entire contents of which are incorporated by reference herein.

TECHNICAL FIELD

The present disclosure relates to semiconductor nanowires and, more particularly, to a semiconductor nanowire photoelectric device including a porous semiconductor segment that is triggered by photons to operate.

BACKGROUND

Korean Patent Registration No. 10-1313176 disclosed a method for fabricating a semiconductor nanowire having a porous nodular structure using chemical etching. However, operation characteristics of the semiconductor nanowire having a porous nodular structure have not been confirmed.

The present inventor confirmed photo-current characteristics of a semiconductor nanowire having a porous nodular structure through additional studies.

SUMMARY

Example embodiments of the present disclosure provide a single semiconductor nanowire photoelectric device which controls an electrical signal only with light.

A photoelectric device according to an example embodiment of the present disclosure is a novel mechanism-based device which is different from a conventional field effect transistor or phototransistor.

A photoelectric device according to an example embodiment of the present disclosure may operate as a logic circuit or a photodetector.

A photoelectric semiconductor nanowire device according to an example embodiment of the present disclosure includes: a semiconductor nanowire doped with a dopant of a first conductivity type and including crystal semiconductor segments which include at least one porous semiconductor segment and are connected to opposite ends of the porous semiconductor segment; and a first electrode and a second electrode respectively disposed in the crystal semiconductor segments around the porous semiconductor segment to provide an electrical connection. The crystal semiconductor segment includes a crystal semiconductor, and the porous semiconductor segment includes a porous semiconductor. The semiconductor nanowire provides a current according to the intensity of an external light when the external light is irradiated to the porous semiconductor segment.

In example embodiments, the semiconductor nanowire may include silicon.

In example embodiments, a porosity of the porous semiconductor segment may be between 50 and 80 percent.

In example embodiments, in the semiconductor nanowire, a diameter of the porous semiconductor segment may be smaller than or equal to that of the crystal semiconductor segment.

In example embodiments, the first electrode and the second electrode may include at least one of Ti, Cr, Au, Pt, Pd, Al, Ag, and a combination thereof.

In example embodiments, a diameter of the semiconductor nanowire may be between 20 and 220 nm and a length of the porous semiconductor segment may be between 10 and 1200 nm.

In example embodiments, the first conductivity type of the semiconductor nanowire may be n-type and a doping concentration of an n-type dopant may be between $10^{15}/cm^3$ and $10^{19}/cm^3$.

In example embodiments, a portion of the semiconductor nanowire which is in contact with the first electrode and the second electrode may have a higher concentration than the other portions.

In example embodiments, the semiconductor nanowire may include a first porous semiconductor segment and a second porous semiconductor segment which are spaced apart from each other. The first porous semiconductor segment and the second porous semiconductor segment may be connected to each other by the crystal semiconductor region.

In example embodiments, the photoelectric semiconductor nanowire device may further include: a third electrode disposed on the crystal semiconductor segment disposed between the first porous semiconductor segment and the second porous semiconductor segment.

In example embodiments, the semiconductor nanowire includes a first porous semiconductor segment and a second porous semiconductor segment which are spaced apart from each other. The photoelectric semiconductor nanowire device may further include: a third electrode disposed between the first electrode and the second electrode to be adjacent to and spaced apart from the first electrode. The first porous semiconductor segment and the second porous semiconductor segment may not be disposed between the first electrode and the third electrode.

In example embodiments, the semiconductor nanowire further may include a semiconductor contact region directly connected to opposite ends of the semiconductor nanowire. The semiconductor contact region may have a larger area than the semiconductor nanowire. Each of the first electrode and the second electrode may be disposed on the semiconductor contact region.

In example embodiments, the semiconductor nanowire may operate as a phototransistor.

In example embodiments, the semiconductor nanowire may operate as a photodetector.

In example embodiments, the semiconductor nanowire may operate as a logic device.

A photoelectric semiconductor nanowire device according to another example embodiment of the present disclosure includes: a semiconductor substrate; an insulating layer disposed on the semiconductor substrate; a semiconductor nanowire disposed on the insulating layer, doped with a dopant of a first conductivity type, and including porous semiconductor segments which include at least one porous semiconductor segment and are connected to opposite ends of the porous semiconductor segment; and a first electrode and a second electrode respectively disposed in the crystal semiconductor segments around the porous semiconductor segment to provide an electrical connection. The semiconductor segment includes a crystal semiconductor, and the porous semiconductor segment includes a porous semiconductor. The semiconductor nanowire provides a current according to the intensity of an external light when the external light is irradiated to the porous semiconductor segment.

A method for manufacturing a photoelectric semiconductor nanowire device according to an example embodiment of the present disclosure includes: forming an insulating layer and a semiconductor layer on a semiconductor substrate; patterning the semiconductor layer to form a nanowire doped with a dopant of a first conductivity type; forming at least one porous semiconductor segment in the semiconductor nanowire; and forming a first electrode and a second electrode at opposite ends of the semiconductor nanowire, respectively.

In example embodiments, forming the at least one porous semiconductor segment in the semiconductor nanowire may include: performing electron beam resist patterning to open a region in which the porous semiconductor segment is to be formed; forming the porous semiconductor segment by dipping a semiconductor substrate with the electron beam resist pattern, where the area in which the porous semiconductor segment is to be formed is opened, in an HF/AgNO$_3$/H$_2$O solution; and removing Ag particles attached to the porous semiconductor segment by dipping the semiconductor substrate with the porous semiconductor substrate into a nitric acid solution.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
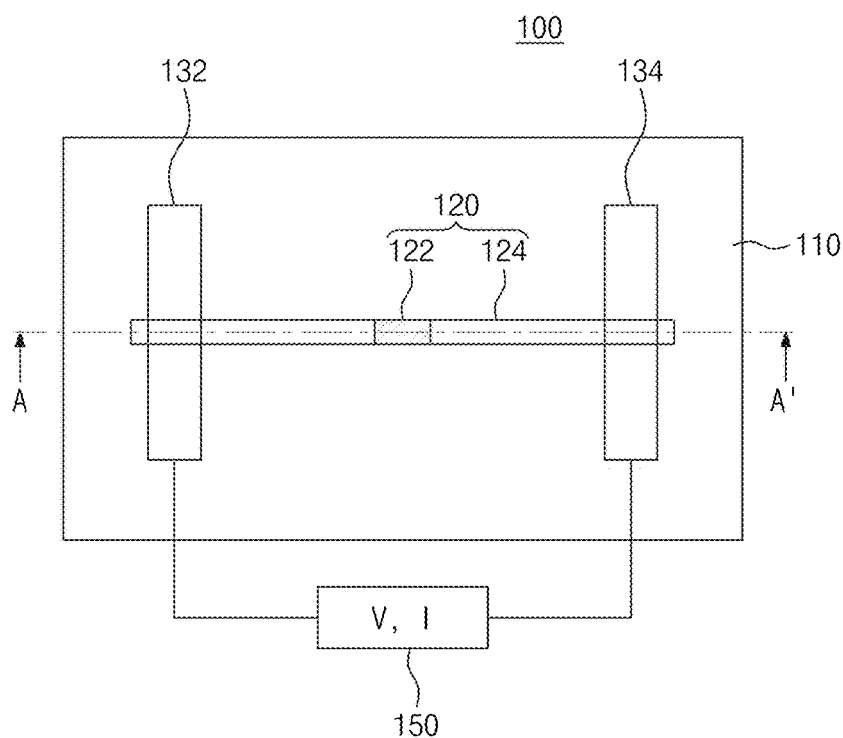
FIG. 1A is a top plan view of a nanowire device according to an example embodiment of the present disclosure.

A transistor is one of the most important basic components constituting a today's electronic device and operates in such a way to control electrical characteristics with an electrical signal. Various efforts have been made to enhance operating efficiency of a transistor. A nano-sized transistor is fabricated to effectively change electrical characteristics or light is irradiated to a transistor to improve switching effect.

The present inventor has studies characteristics of a crystal silicon nanowire including porous silicon having a length of several hundreds of nanometers. Porous silicon has a great number of nanometer-sized pores formed therein, which may strongly bind injected electrons. That is, even when a voltage is applied to opposite ends of a synthesized silicon nanowire, almost no current flows because of a porous silicon area. Therefore, since an advantage of the porous silicon is not great as an electronic element, the porous silicon has not been used so far. However, the present inventor confirmed a result that current does not flow well to porous crystal silicon but a photocurrent is generated when light is irradiated to the porous crystal silicon.

According to an example embodiment of the present disclosure, a novel transistor is proposed by inversely using such poor electrical characteristics of porous silicon. When light (e.g., laser) is irradiated to a porous silicon area, a great number of bound electrons receive energy to be escaped. Thus, electric conductivity is improved to allow a large current to flow. That is, the light may effectively control electrical characteristics of a nanowire. As compared to the fact that almost no current flows when there is no light, it was observed that a current was amplified at least one million times only by irradiating light. Additionally, a transistor having two porous silicon areas in a single silicon nanowire was fabricated to implement a novel logic circuit. A desired output value may be obtained by regarding a value corresponding to whether laser beam is irradiated to each of the porous silicon areas as an input value and performing logic AND, OR, and NAND operations. Since such a logic circuit is a basic element for all computers, a computer capable of carrying out computation with light may be developed.

A transistor which is very sensitive to light was developed by further reducing diameter of a silicon nanowire to about 25 nanometers. The transistor may be used as a sensitive photodetector which is capable of detecting a weak light. According to the present disclosure, a novel photodetector having a high integration less than 1 micrometer was implemented by closely inserting multiple porous silicon areas into a silicon nanowire.

Photon-triggered electronic circuits have been a long-standing goal of photonics. Recent demonstrations include either all-optical transistor in which photons control other photons or phototransistors with the gate response tuned or enhanced by photons. However, only a few studies report on devices in which electronic currents are optically switched and amplified.

In the present disclosure, photon-triggered nanowire (NW) transistors, photon-triggered NW logic gates, and a single logic NW photodetection system are disclosed. A nanowire (NW) includes a long crystal silicon (CSi) segment connecting opposite ends of a short porous silicon segment.

Electric contacts on opposite ends of a nanowire are connected to a single porous silicon segment in the middle. Exposing the porous silicon segment to light triggers a current in the NW with a high on/off ratio of $8 \times 10^6$ or more.

A device containing two porous silicon segments along a nanowire may be triggered using two independent optical input signals. Photon-triggered logic gates including AND, OR, and NAND gates are provided using a localized pump laser. A photon-triggered nanowire transistor of diameter 25 nm with a single 100 nm porous silicon segment requires power of 300 pW or less.

Furthermore, a submicrometer-resolution photodetection system having high photosensitivity is provided. Photon-triggered transistors offer a new venue towards multifunctional device applications such as programmable logic elements and ultrasensitive photodetectors.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1A is a top plan view of a nanowire device according to an example embodiment of the present disclosure.

Figure 1B:
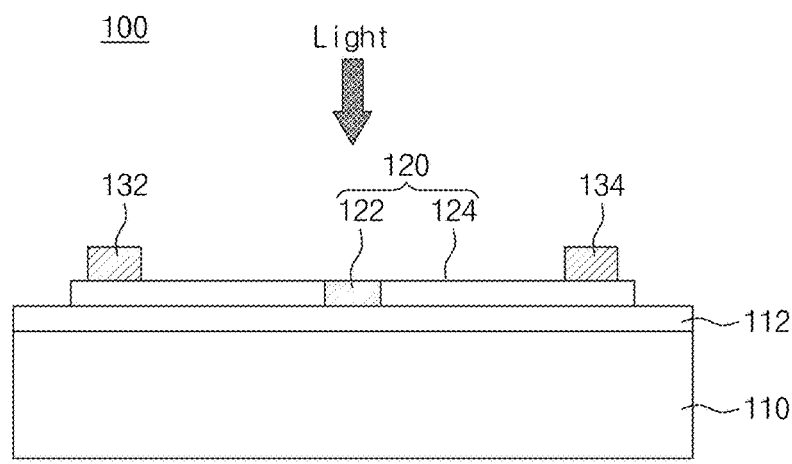
FIG. 1B is a cross-sectional view taken along the line A-A' in FIG. 1A.

FIG. 1B is a cross-sectional view taken along the line A-A' in FIG. 1A.

Referring to FIGS. 1A and 1B, a photoelectric semiconductor nanowire device 100 includes: a semiconductor substrate 110; an insulating layer 112 disposed on the semiconductor substrate 110; a semiconductor nanowire 120 disposed on the insulating layer 112, doped with a dopant of a first conductivity type, and including crystal semiconductor segments which include at least one porous semiconductor segment 122 and are connected to opposite ends of the porous semiconductor segment 122; and a first electrode 132 and a second electrode 134 respectively disposed at the crystal semiconductor segments 124 around the porous semiconductor segment 122 to provide an electrical connection. The crystal semiconductor segment 124 includes a crystal semiconductor, and the porous semiconductor segment 122 includes a porous semiconductor. The semiconductor nanowire 120 provides a current according to the intensity of an external light when the external light is irradiated to the porous semiconductor segment 122.

The semiconductor substrate 110 may be a silicon (Si) substrate, a germanium (Ge) substrate or a III-V group semiconductor substrate. Preferably, the semiconductor substrate 100 may be a lower substrate in a silicon-on-insulator (SOI) substrate.

The insulating layer 112 may have a single structure of silicon oxide or a multilayer structure of silicon oxide/silicon nitride.

The semiconductor nanowire 120 may include the same material as the semiconductor substrate 100, i.e., may include silicon. The semiconductor nanowire 120 may be patterned on the insulating layer 120 or transferred onto the insulating layer after being fabricated in another manner. The semiconductor nanowire 120 may include at least one porous semiconductor segment 122. The porous semiconductor segment 122 may have a plurality of pores. A porosity of the porous semiconductor segment 122 may be between 50 and 80 percent. In the semiconductor nanowire 120, a diameter of the porous semiconductor segment may be equal to or smaller than that of the crystal semiconductor segment 124. The semiconductor nanowire 120 may be doped with a dopant of a first conductivity type. The first conductivity type may be n-type. A doping concentration of n-type dopant may be between $10^{15}/cm^3$ and $10^{19}/cm^3$. Even when the doping concentration of n-type dopant is between $10^{15}/cm^3$ and $10^{19}/cm^3$, good photoelectric characteristics were exhibited. The diameter of the semiconductor nanowire 120 may be between 20 and 220 nm. Length of the porous semiconductor segment 122 may be between 10 and 1200 nm. When the length of the porous semiconductor segment is less than 10 nm, a current generated by tunneling may flow.

The first electrode 132 and the second electrode 134 may be spaced apart from each other with the porous semiconductor segment 122 interposed therebetween to be disposed on the crystal semiconductor segment 124. The first electrode 132 and the second electrode 134 may form an ohmic junction with the crystal semiconductor segment 124. The first electrode 132 and the second electrode 134 may include at least one of Ti, Cr, Au, Pt, Pd, Al, Ag, and a combination thereof. More specifically, the first electrode 132 and the second electrode 134 may include Ti/Pd, Ti/Al, Ti/Ag, Ti/Pt, Ti/Pd/Au, Ti/Au, Cr/Pd, Cr/Al, Cr/Ag, Pd, Al or Ag. The first electrode 132 and the second electrode 134 may include silicide.

A power source 150 may measure a current flowing to the semiconductor nanowire 120 while applying a constant bias voltage between the first electrode 132 and the second electrode 134. The power source 150 may include an amplifier configured to convert a current to a voltage signal and may be integrated into the semiconductor substrate 110.

An external light source may be a short-wavelength light source or a light source having a broad bandwidth. The photoelectric semiconductor nanowire device 100 may react to the external light source to provide a current. The photoelectric semiconductor nanowire device 100 may include a band pass filter to selectively transmit only a specific wavelength band or a microlens to focus the external light. The photoelectric semiconductor nanowire device 100 may further include a protection layer covering the semiconductor nanowire 120.

The photoelectric semiconductor nanowire device 100 includes: a semiconductor nanowire 120 doped with a dopant of a first conductivity type and including crystal semiconductor segments 124 which include at least one porous semiconductor segment 122 and are connected to opposite ends of the porous semiconductor segment 122; and a first electrode 132 and a second electrode 134 respectively disposed in the crystal semiconductor segments around the porous semiconductor segment to provide an electrical connection. The crystal semiconductor segment 124 includes a crystal semiconductor, and the porous semiconductor segment 122 includes a porous semiconductor. The semiconductor nanowire 120 provides a current according to the intensity of an external light when the external light is irradiated to the porous semiconductor segment 122. The photoelectric semiconductor nanowire device 100 may be disposed on a glass substrate or a plastic substrate, instead of a semiconductor substrate.

FIGS. 2A through 2F illustrate a method for manufacturing a photoelectric device according to an example embodiment of the present disclosure.

Referring to FIGS. 2A through 2F, a method for manufacturing a photoelectric semiconductor nanowire device 100 includes: forming an insulating layer 112 and a semiconductor layer 121 on a semiconductor substrate 110; patterning the semiconductor layer to form a nanowire 120 doped with a dopant of a first conductivity type; forming at least one porous semiconductor segment 122 in the semiconductor nanowire 120; and forming a first electrode 132 and a second electrode 134 at opposite ends of the semiconductor nanowire 120, respectively.

Figure 2A:
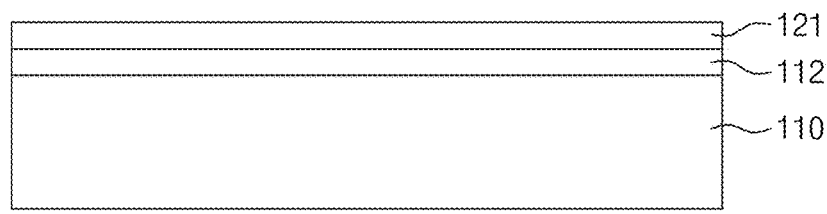
FIGS. 2A through 2F illustrate a method for manufacturing a photoelectric device according to an example embodiment of the present disclosure.

Referring to FIG. 2A, an insulating layer 112 and a semiconductor layer 121 are formed on a semiconductor substrate 110. The semiconductor substrate 110 may be a silicon substrate, and the insulating layer 112 may be a silicon oxide layer. The semiconductor layer 121 may be a crystalline silicon thin film. The semiconductor substrate 110, the insulating layer 112, and the semiconductor layer 121 may be an SOI substrate. The semiconductor layer 121 may be doped with an n-type dopant. A doping concentration of the n-type dopant may be $10^{15}/cm^3$ to $10^{19}/cm^3$.

Figure 2B:
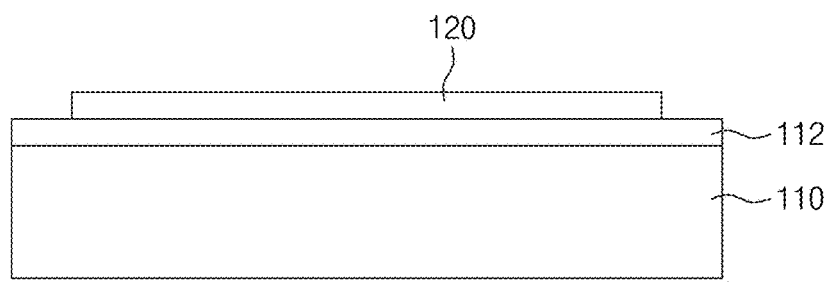

Referring to FIG. 2B, the semiconductor layer 121 may be patterned to form a semiconductor nanowire 120 doped with a dopant of a first conductivity type. More specifically, a photoresist or an electron beam resist may be patterned by photolithography or electron beam lithography and an anisotropic etch is performed using a photoresist mask or an electron beam resist mask to form the semiconductor nanowire 120. The insulating layer 112 may operate as an etch-stop layer.

Figure 2C:
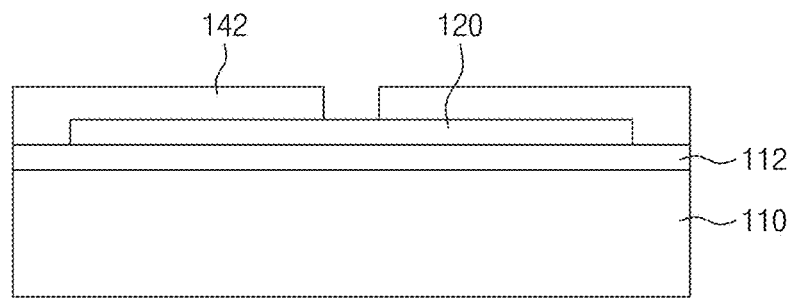

Referring to FIG. 2C, at least one porous semiconductor segment 122 may be formed in the semiconductor nanowire 120. A photoresist pattern or an electron beam resist pattern 142 may be formed to open an area in which the porous semiconductor segment 122 is to be formed. The photoresist pattern or the electron beam resist pattern 142 may use photolithography or electron beam lithography. Thus, the area in which the porous semiconductor segment 120 is to be formed may be exposed. A material of the photoresist pattern or the electron beam resist pattern 142 may be polymethyl methacrylate (PMMA).

Figure 2D:
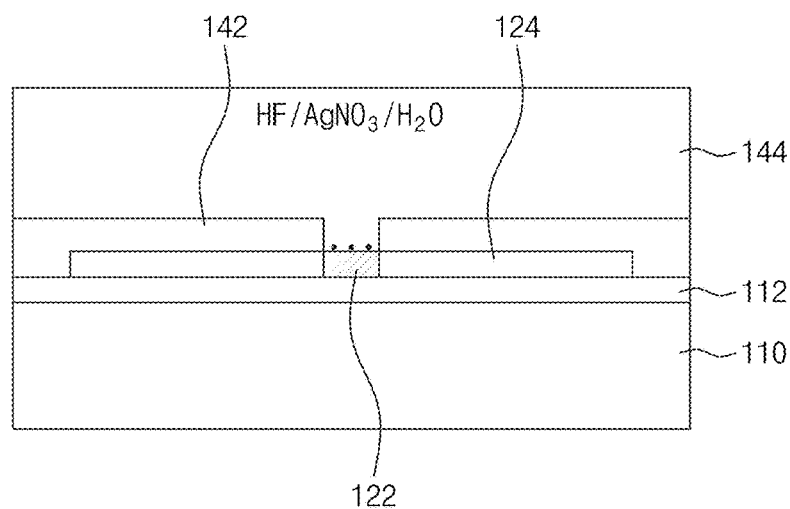

Referring to FIG. 2D, the porous semiconductor segment 122 may be formed by dipping the semiconductor substrate 110 with the photoresist pattern or the electron beam resist pattern 412, where the area in which the porous semiconductor segment 122 is to be formed is opened, in an $HF/AgNO_3/H_2O$ solution. In this case, $AgNO_3$ may form a silver nanoparticle at a silicon semiconductor, silicon underlying the silver nanoparticle may be transformed into silicon oxide, and HF may wet etch the silicon oxide to form a porous silicon segment.

Figure 2E:
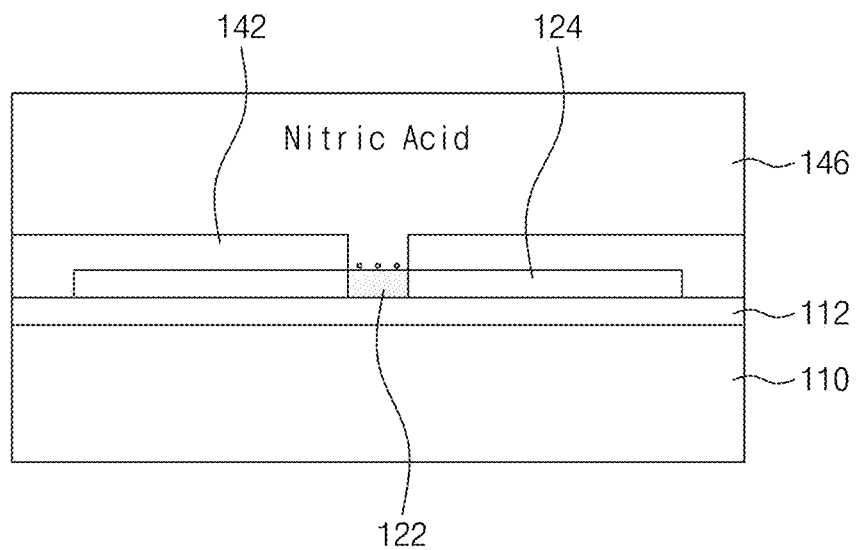

Referring to FIG. 2E, Ag particles attached to the porous semiconductor segment 122 may be removed by dipping the semiconductor substrate 110 with the porous semiconductor substrate 122 into a nitric acid solution. Then, the photoresist pattern or the electron beam resist pattern 142 may be removed.

Figure 2F:
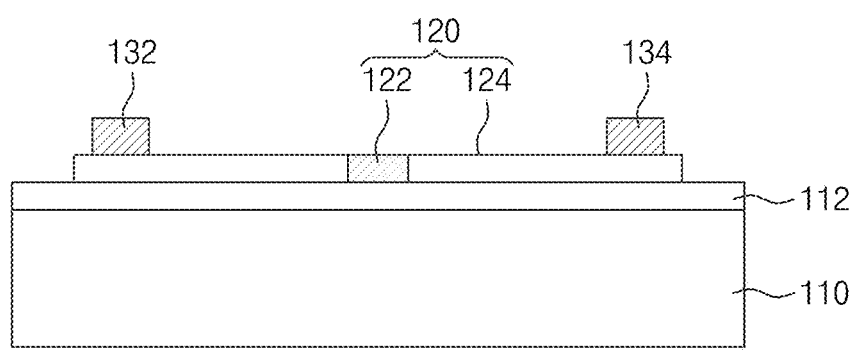

Referring to FIG. 2F, a first electrode 132 and a second electrode 134 may be formed at opposite sides of the semiconductor nanowire 120 including the porous semiconductor segment 122, respectively. The first electrode 132 and the second electrode 134 may be formed by means of deposition using lift-off. The deposition may be thermal evaporation deposition, sputtering deposition or ion beam evaporation deposition. The first electrode 132 and the second electrode 134 may include Ti/Pd, Ti/Al, Ti/Ag, Ti/Pt, Ti/Pd/Au, Ti/Au, Cr/Pd, Cr/Al, Cr/Ag, Pd, Al or Ag. Alternatively, the first electrode 132 and the second electrode 134 may include silicide. The silicide may be $WSi_2$ or $CoSi_2$.

In a method for fabricating a semiconductor nanowire according to a modified embodiment of the present disclosure, a portion desired to be porous is doped at $10^{15}/cm^3$ and a portion not desired to be porous is doped at $10^{19}/cm^3$. Afterward, if the doped portions are dipped in an HF solution for several minutes, only the portion doped at $10^{19}/cm^3$ may be transformed into a porous structure.

Figure 3:
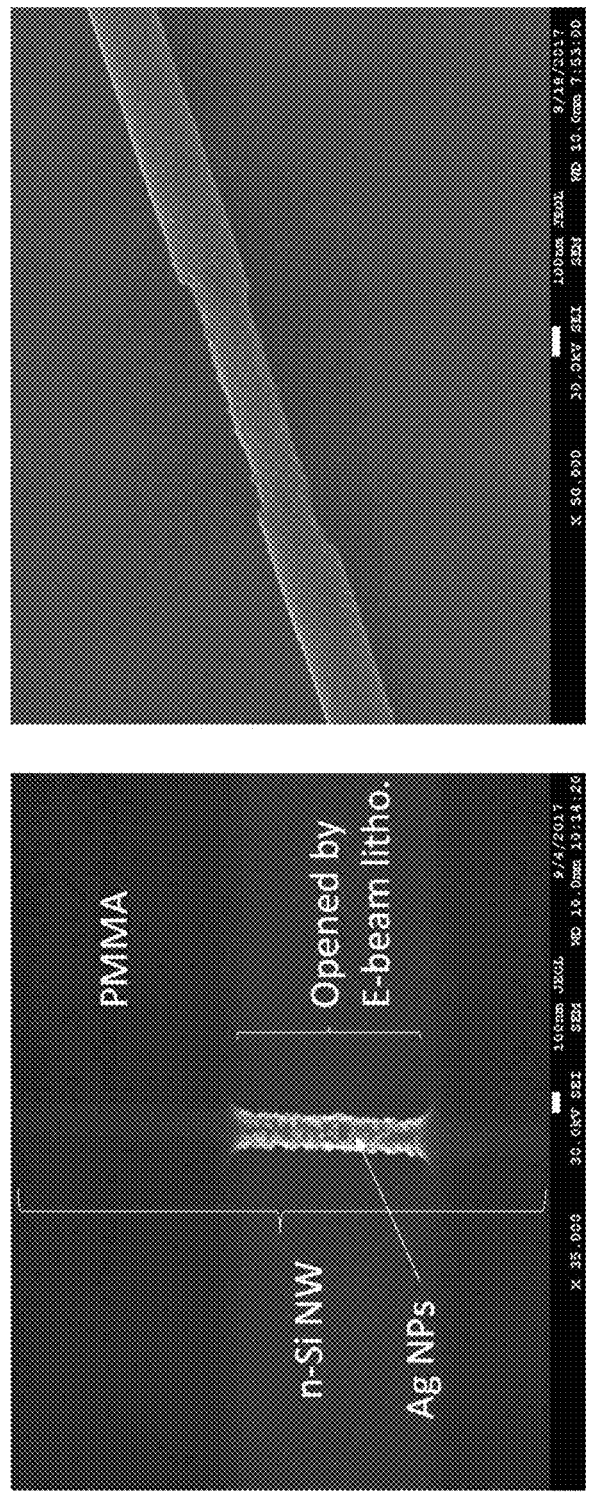
FIG. 3 shows SEM images of a silicon nanowire fabricated according to another example embodiment of the present disclosure.

FIG. 3 shows SEM images of a silicon nanowire fabricated according to another example embodiment of the present disclosure.

Referring to FIG. 3, PMMA was used as an electron beam resist pattern 142. Patterning was performed using electron beam lithography. A semiconductor nanowire 120 is a silicon nanowire. While a porous semiconductor segment 122 is formed by dipping the PMMA in an $HF/AgNO_3/H_2O$ solution, Ag nanoparticles are observed on a surface of the porous semiconductor segment 122. The Ag nanoparticles may be removed using nitric acid.

FIGS. 4A through 4H illustrate a structure indicating a photoelectric semiconductor nanowire device according to an example embodiment of the present disclosure and experiment results.

Figure 4A:
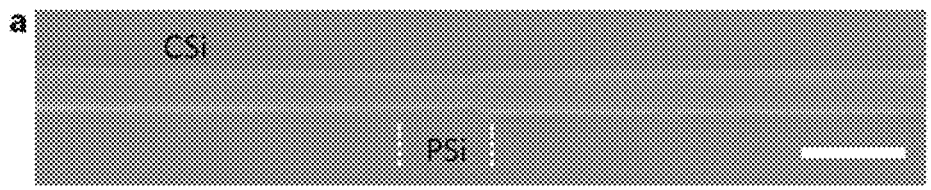
FIGS. 4A through 4H illustrate a structure indicating a photoelectric semiconductor nanowire device according to an example embodiment of the present disclosure and experiment results.

FIG. 4A is an SEM image of a semiconductor (silicon) nanowire device including a single porous silicon segment 122 (Device 1). A diameter of the semiconductor nanowire 120 and a length of the porous silicon segment 122 are 180 nm and 450 nm, respectively.

Figure 4B:
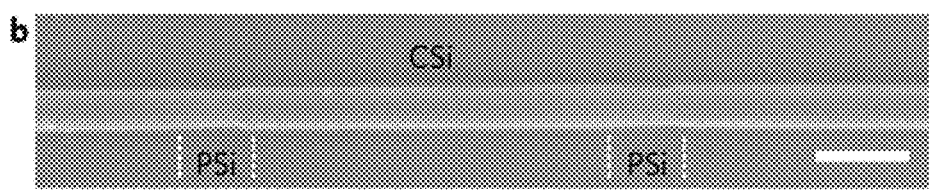

FIG. 4B is an SEM image of a semiconductor (silicon) nanowire device including two porous silicon segments 122 (Device 2). A diameter of the semiconductor nanowire 120 and a length of the porous silicon segment 122 are 200 nm and 400 nm, respectively.

Figure 4C:

FIG. 4C is a TEM image of a semiconductor (silicon) nanowire which includes a single porous semiconductor (silicon) segment 122 and has a diameter of 25 nm.

Figure 4D:
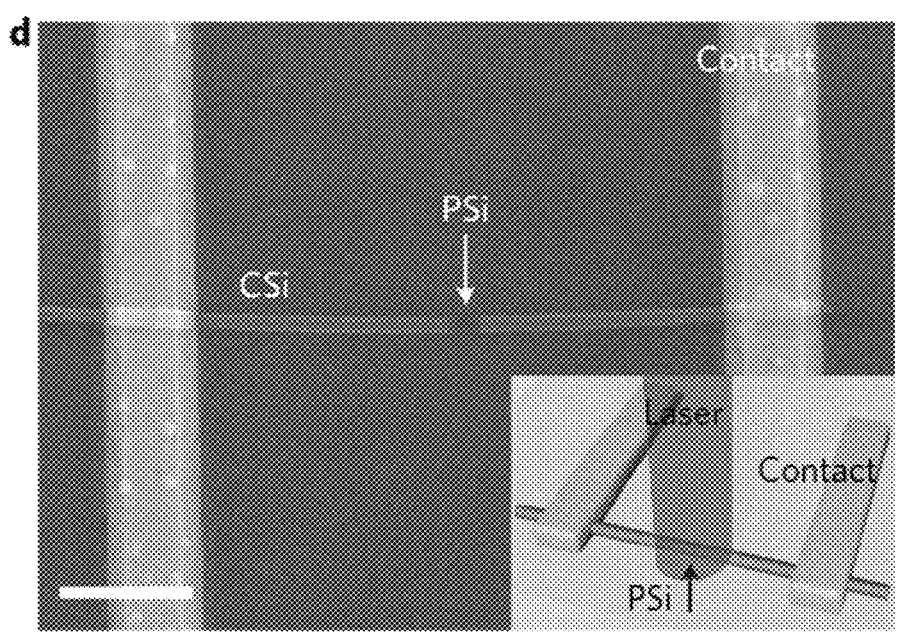

FIG. 4D is an SEM image of a semiconductor (silicon) nanowire. A porous silicon (semiconductor) segment is disposed in the center of the semiconductor nanowire having a diameter of 180 nm. A pump laser of 658 nm impinges on the porous semiconductor (silicon) segment.

Figure 4E:
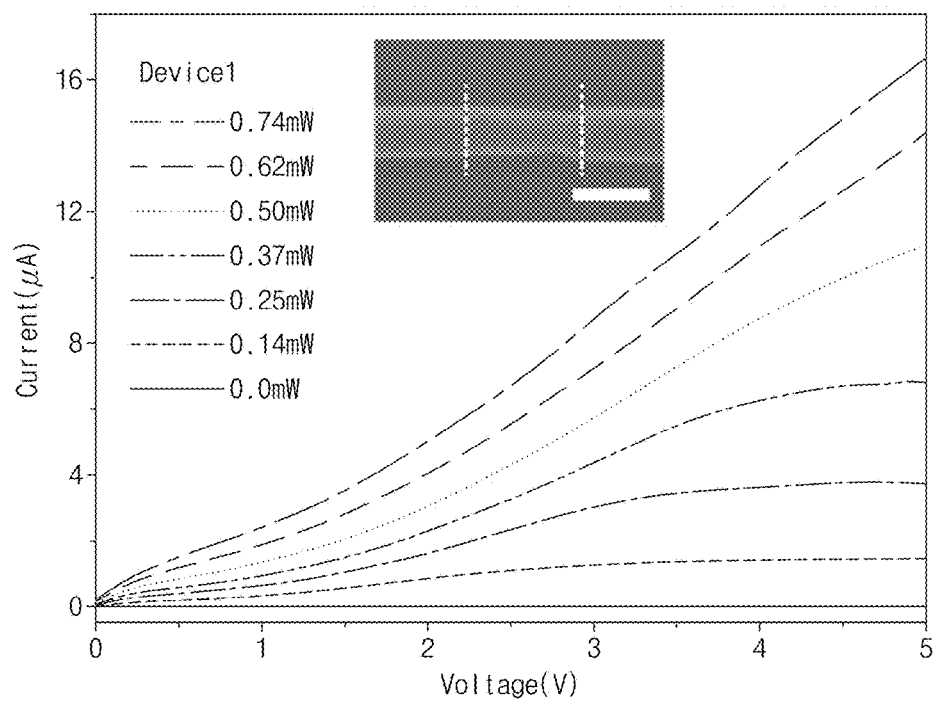

FIG. 4E shows I-V curves depending on pump laser power at a semiconductor nanowire including a porous semiconductor (silicon) segment having a length of 450 nm.

Figure 4F:
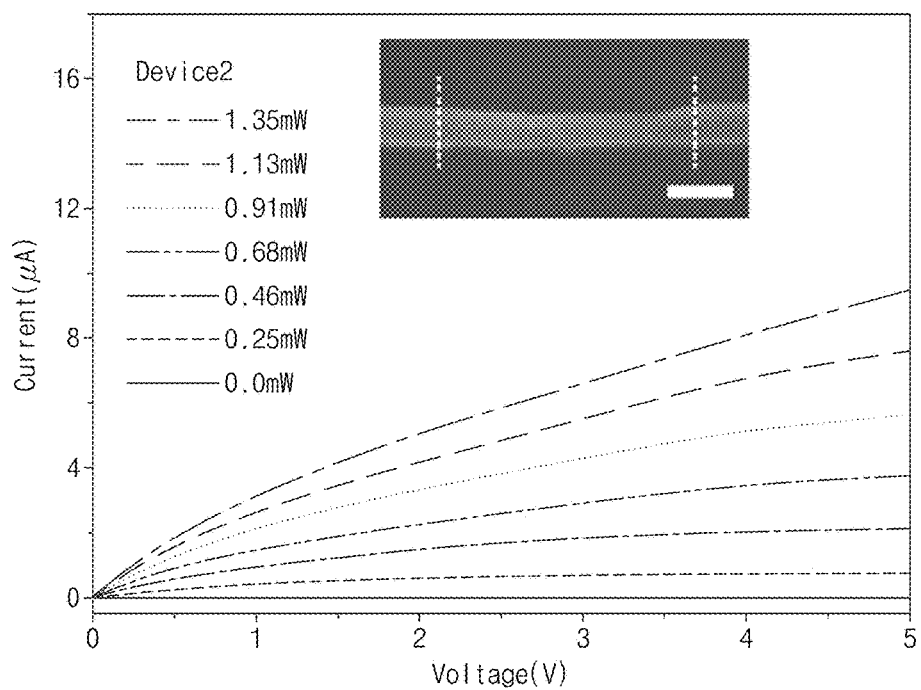

FIG. 4F shows I-V curves depending on pump power laser at a semiconductor nanowire including a porous semiconductor (silicon) segment having a length of 1180 nm. When the porous semiconductor (silicon) was aligned with the center of a laser spot, power of a pump laser impinging on the porous semiconductor (silicon) segment was obtained by considering an area fraction of the porous semiconductor (silicon) segment within the laser spot.

Figure 4G:
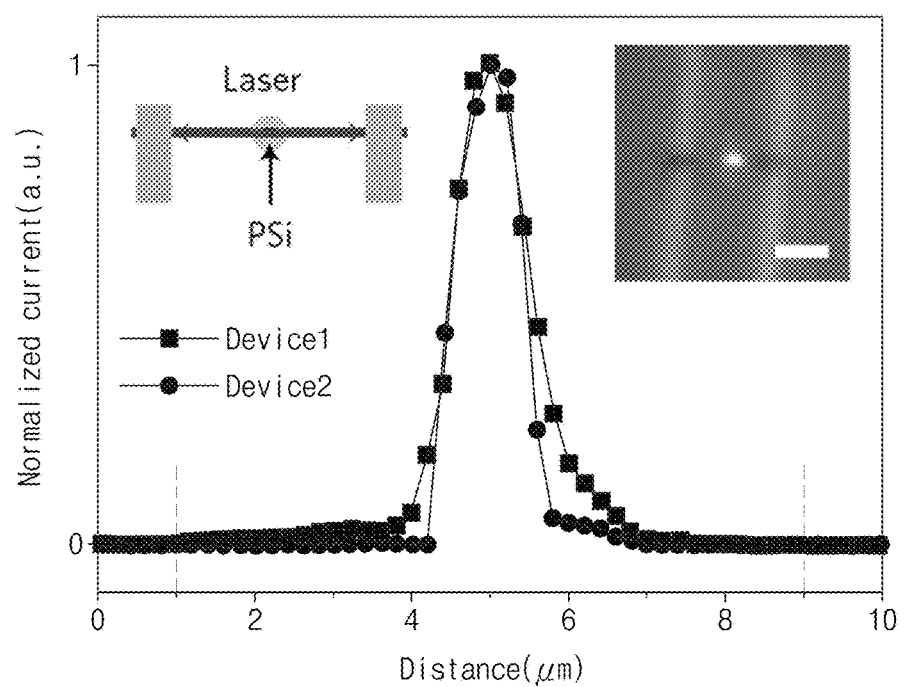

FIG. 4G shows a measured current obtained by line-scanning a pumping laser along a semiconductor nanowire axis at a bias voltage of 5 volt. A quadrangle indicates a result for the Device 1, and a circle indicates a result for the Device 2. The power of the pump laser is 0.74 mW for the Device 1 and 1.34 mW for the Device 2. Each curve was normalized by its maximum current. Each curve exhibits full-width at half maximum of less than 1 µm because of the spot size of the pump laser. Dotted lines indicate the edge of metal contact (first electrode and second electrode).

Figure 4H:
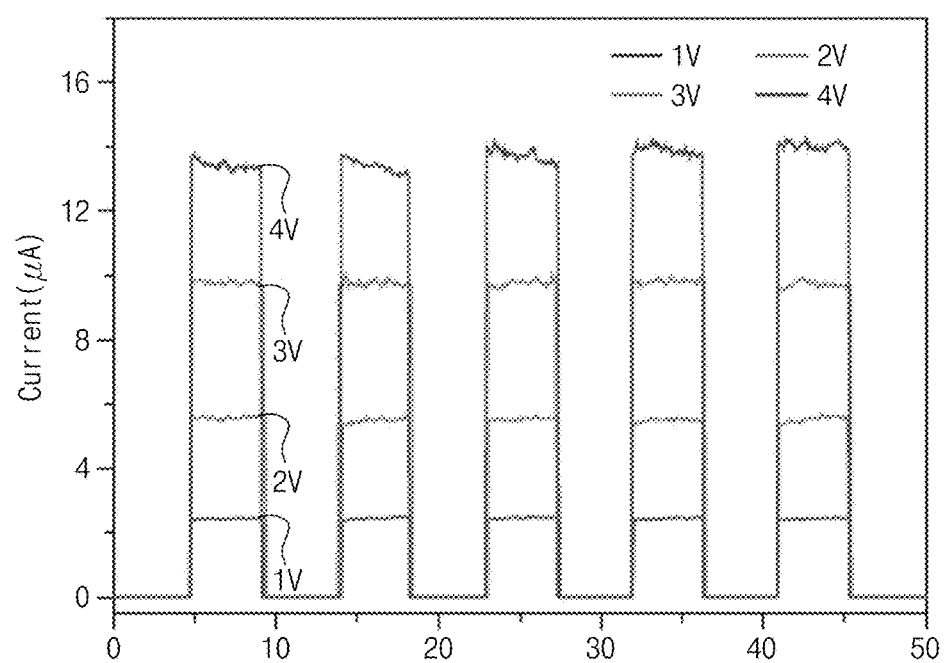

FIG. 4H indicates a temporal response of the current measured in the Device 1. The width, interval, and peak power of a pulsed pump laser are 4.3 s, 9 s, and 0.75 mW or less, respectively. The bias voltage varied from 1 volt to 4 volts at intervals of 1 volt.

The photoelectric semiconductor nanowire device 100 includes a reservoir that supplies carriers connected to a channel that collects carriers emitted from the reservoir. Specifically, the porous semiconductor (silicon) segment 122 acts as a reservoir of high-density localized electronic states, and the crystal silicon segment 124 constitutes a channel with a higher carrier mobility. Metal-assisted chemical etching is used to fabricate the semiconductor (silicon) nanowire 120 including the porous semiconductor (silicon) segments 122. Electron microscopy is used to characterize these porous semiconductor (silicon) areas along the semiconductor (silicon) nanowire 120.

Scanning electron microscopy (SEM) images show a semiconductor nanowire including one porous semiconductor (silicon) segment and two porous semiconductor (silicon) segments. The porous semiconductor (silicon) segment 122 has a slightly smaller diameter and rougher surface than the crystal semiconductor (silicon) segments 124.

A semiconductor nanowire having a smaller diameter and multiple porous silicon segments is synthesized. The transmission electron microscopy (TEM) image reveals a single semiconductor (silicon) nanowire having a diameter of 25 nm with one porous semiconductor (silicon) segment.

Crystal structures of the crystal semiconductor (silicon) segments 124 and the porous semiconductor (silicon) segment 122 are characterized by high-resolution TEM images. A single crystal lattice is observed in the semiconductor (silicon) segments 124, whereas a porous crystal lattice is observed in the porous semiconductor (silicon) segment 122. Weak but observable patterns appear in the fast Fourier transform of the porous silicon segment because of the presence of the lattice.

To examine and control the current along a nanowire with a single porous silicon segment, source and drain metal contacts (a first electrode and a second electrode) are formed at opposite ends of the nanowire and bias voltages are applied.

FIG. 4D shows an SEM image of a semiconductor (silicon) nanowire device including a porous semiconductor (silicon) segment in the middle. A continuous-wave (CW) pump laser having a wavelength of 658 nm was focused onto the porous semiconductor (silicon) segment 122. The current-voltage (I-V) curves were measured using different laser pumping powers.

We examined two devices having different porous semiconductor (silicon) segment lengths of 450 nm and 1,180 nm. In the dark, the current increased from 0 to 2 pA or less for zero to 5 voltage sweeps, for both the semiconductor nanowire devices. On the other hand, when laser light impinged on the porous silicon (semiconductor) segment 122, a significant current was observed. In particular, the current of the Device 1 was 16 µA or less for a bias voltage of 5 volts and pump power of 0.74 mW. Thus, we observed current enhancement of $8\times10^6$ or less when comparing the dark current with the photon-triggered current. The current enhancement of $10^6$ was also observed in the Device 2 with a longer porous semiconductor (silicon) segment 122.

Next, to investigate the spatial dependence of photon-triggered current generation by the pump laser spot, current for devices 1 and 2 was measured via a line scan with a step of 200 nm along their nanowire axes at a bias voltage of 5 volts. The fixed pump laser was focused to a spot size of 1 µm or less on the Devices 1 and 2. As the pump laser spot overlapped the porous semiconductor (silicon) segment of each device, the current increased rapidly and reached a maximum value in the center of the porous semiconductor (silicon) segment 122. The current measured when the laser spot overlapped with the Psi segment of each device was at least 450 times larger than the current when the laser spot overlapped the crystal silicon area that was 3.4 µm distant from the center of the porous semiconductor (silicon) segment 122. Therefore, the line-scan measurement strongly suggests that the current was generated from the porous silicon segment of the device.

The I-V characteristics and line-scan measurements of a single nanowire device including the single porous semiconductor (silicon) segments 122 exhibit several unique features. First, the dark current is only a few picoamperes (pA) even when a voltage bias is applied to the device. We believe that injected carriers are trapped in localized electronic states along the porous semiconductor (silicon) segment 122 to inhibit a current flowing across the electrodes. Second, the current is efficiently controlled by optically pumping the porous semiconductor (silicon) segment 122. When light impinges on the porous semiconductor (silicon) segment 122, the trapped electrons are excited into higher electronic states that enable a current to flow across the electrodes. In the measurement of a current responsivity as a function of the incident wavelength, a smaller responsivity is observed for a longer wavelength. A current is also measured when the photon energy is less than the band gap of silicon. Thus, we observe that photons act as an effective trigger to generate the current. Third, with increasing pump power, more carriers are excited and a larger current is generated. A high on/off current ratio of $10^6$ or more is achieved, which is comparable to the best values of previous Si NW field effect transistors (FETs). Fourth, the porous semiconductor (silicon) segment 122 is much more sensitive to the localized pump laser.

The single silicon nanowire 120 including the porous semiconductor (silicon) segment 122 acts as a high-on/off current ratio device that can be triggered by optically pumping the porous semiconductor (silicon) segment 122. The carriers generated from the porous semiconductor (silicon) segment 122 diffuse along the entire length of the NW, which increases the effective carrier density along the entire semiconductor nanowire 120. This unique nanowire device 100 may be a photon-triggered nanowire transistor device. Properties of the photon-triggered nanowire transistor device mirror several of the same electrical characteristics of conventional FETs.

In addition, we characterized the temporal response of the photon-triggered nanowire transistors by measuring the time-dependent current response to laser pulse cycles. In response to the laser cycle, the measured current level reproducibly cycles between the off and on states. The current for the on state is a function of the bias voltage. Next, we measured the transient current when a shorter laser pulse having a width of 250 µs was injected into the porous semiconductor (silicon) segment 122. The measurement result shows 28 µs rise/fall times, which is comparable to the photo response times previously reported in silicon nanowire devices.

The device functionality of photon-triggered nanowire transistors may be extended by adding more porous semiconductor (silicon) segments 122 to the semiconductor nanowire 120 and adjusting the design of the metal contacts (electrodes). For example, logic gates are developed using the semiconductor nanowire 120 including two porous semiconductor (silicon) segments). We built three types of logic gates with different outputs.

FIGS. 5A through 5F illustrate a logic gate device according to an example embodiment of the present disclosure.

Figure 5A:
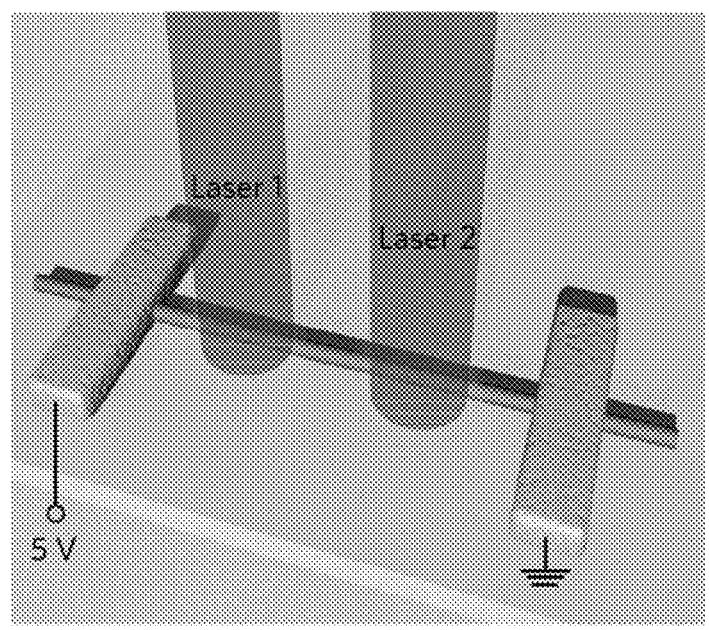
FIGS. 5A through 5F illustrate a logic gate device according to an example embodiment of the present disclosure.

Referring to FIG. 5A, two CW pump lasers (Laser 1 and Laser 2) are focused on each porous semiconductor segment 122 of the semiconductor nanowire device having a diameter of 200 nm. The lasers are independently controlled to provide four input states: '00' or '11' states denote that both lasers are off or on, respectively and '01' or '10' states denote that only one laser is on. A bias voltage of 5 volts is applied to each nanowire device in all cases.

FIG. 5A shows two porous semiconductor (silicon) segments 122 disposed between the two metal contacts.

Figure 5B:
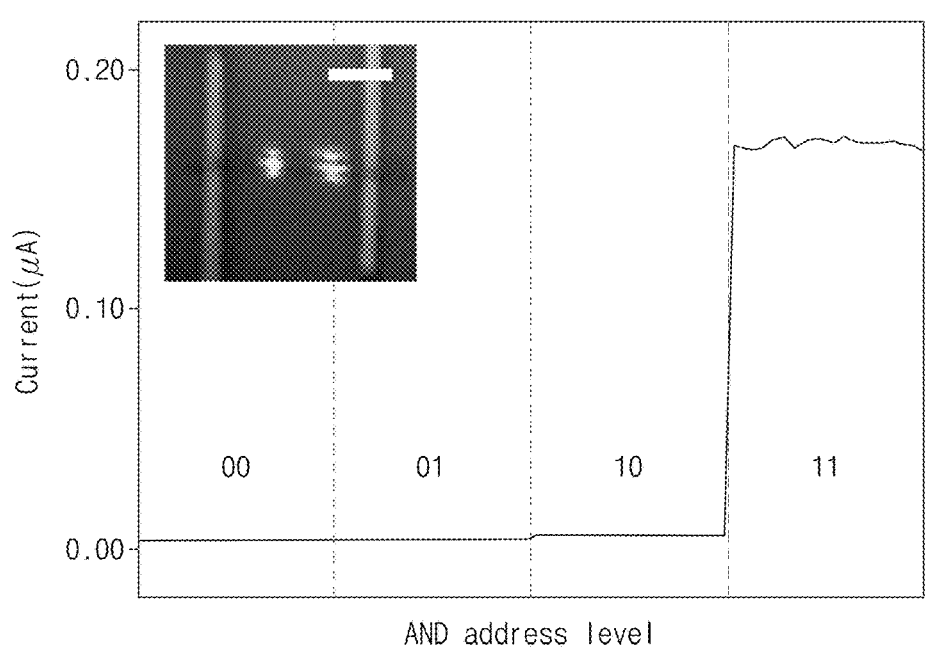

FIG. 5B shows measured output currents for the four input states. Accordingly, the nanowire device constitute an AND gate. The '11' state stands out a significantly larger measured current.

Figure 5C:
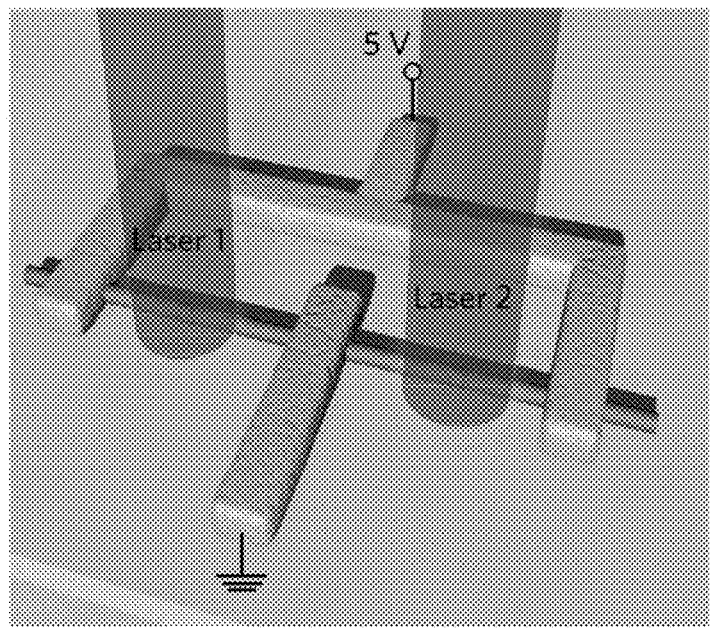

FIG. 5C shows one metal contact disposed between the two porous semiconductor (silicon) segments.

Figure 5D:
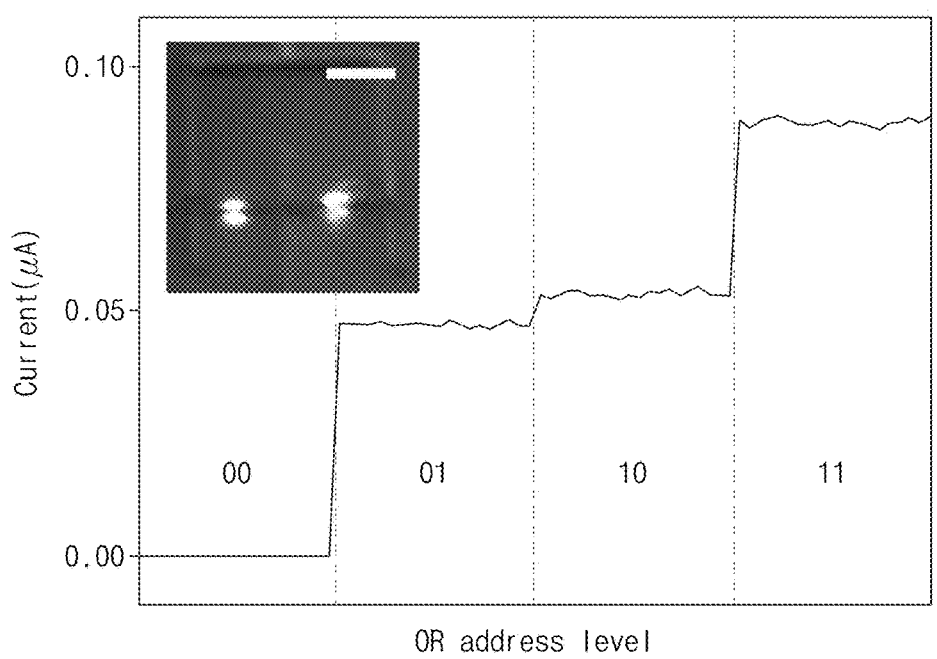

FIG. 5D shows an OR gate having measured output currents for the four input states. The current is negligible in the '00' state in contrast to the other three input states, '01', '10' and '11'. The current is almost doubled for the '11' state. The powers for both laser 1 and laser 2 are 20 µW.

Figure 5E:
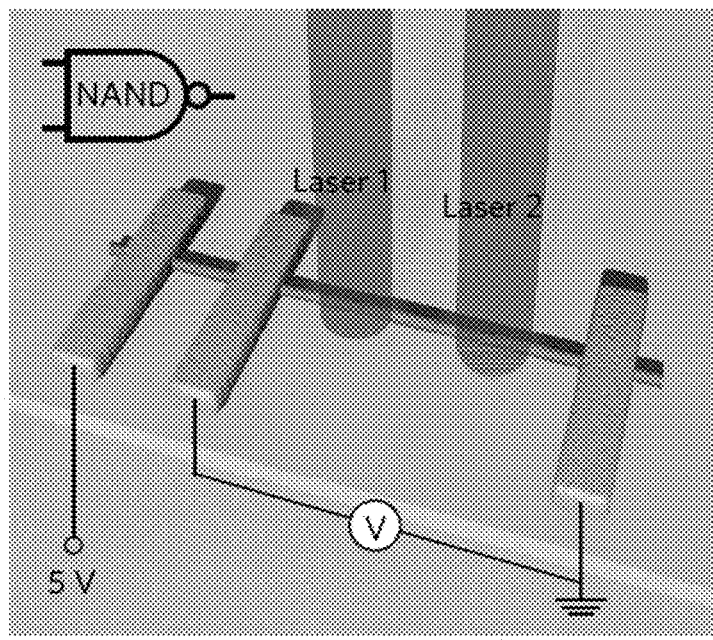

FIG. 5E shows a NAND gate. An outer contact is used to apply a bias voltage of 5 volts, and an inner contact used to measure a voltage is disposed.

Figure 5F:
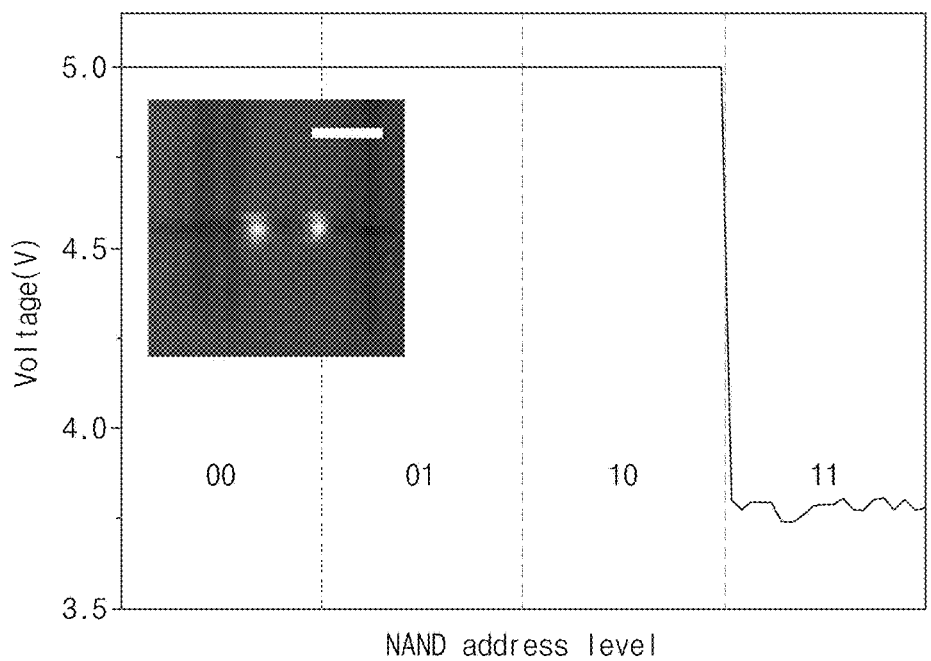

FIG. 5F shows measured output voltages for the four input states of the NAND gate. The output voltages are 5 volts for the '00', '01' and '10' states, whereas the output voltage is only 3.75 volts for the '11' state. The powers for both laser 1 and laser 2 are 10 µW.

An AND gate having a current output, an OR gate having a current output, and a NAND gate having a voltage output are proposed. Two identical but independently controlled CW lasers (laser 1 and laser 2) were focused on their respective porous silicon segments. We defined four states, '00', '01', '10', and '11', which correspond to the four combinations of on (1) and off (0) for the two independently controlled pump lasers.

First, two metal contacts were introduced in the left and right sides of the two porous semiconductor (silicon) segments to apply a bias voltage of 5 volts. The measured currents for the '00', '01', and '10' states were only 5 nA or less. In contrast, the measured current was 0.17 µA or less for the '11' state. A dark current was effectively blocked in the absence of optical pumping of the porous semiconductor (silicon) segments 122. This Boolean logic gate corresponded to the AND gate.

Second, one metal contact was disposed between the two porous semiconductor (silicon) segments and the other contact connected both ends of the semiconductor nanowire 120. A current of 0.05 µA or less was measured for the '01' and '10' states, whereas the current was only 200 pA or less for the '00' state. A current path was enabled by the optically pumped porous semiconductor (silicon) segment. In the '11' state, two current paths were enabled and thus, the current almost doubled compared with the '01' and '10' states. This Boolean logic gate corresponded to the OR gate.

Third, we defined three metal contacts to present voltage outputs. In the left side of the porous semiconductor (silicon) segments, the outer contact was used to apply a bias voltage of 5 volts and the inner contact was used to measure the voltage. The metal contact in the right side of the porous semiconductor (silicon) segments was grounded. Then, an output voltage of 5 volts was measured for the '00', '01', and '10' states, whereas an output voltage of 3.75 volts or less was measured for the '11' state. This Boolean logic corresponded to a NAND gate. A voltage value for the '11' state was determined by the electrical resistances in the crystal semiconductor (silicon) region (between the outer and inner contacts in the left side) and the region including the porous semiconductor (silicon) segments (between the inner and grounded contacts). If the resistance of the crystal semiconductor (silicon) region increases by increasing the crystal semiconductor (silicon) length, the voltage output will be lower than 3.75 volts. Localized optical gating provides operations of various logic gates.

Next, to explore the nanowire functional behavior of a semiconductor nanowire including an ultrasmall porous semiconductor (silicon) segment, we fabricated a device using a silicon nanowire having a diameter of 25 nm and a porous semiconductor (silicon) length of 100 nm. The volume of the porous semiconductor (silicon) segment is 200 times smaller than that of each previously-described porous semiconductor (silicon) segment. The I-V curves were measured for the semiconductor nanowire device while the power of the pump laser varied from 0 to 890 pW. A negligibly small current (subpicoamperes) was measured at a bias voltage of 2 volts or less for all pump powers. The current increased rapidly as the voltage increased to 3 volts or less. In addition, the current of the semiconductor nanowire device was measured according to the power of the pump laser.

We varied the bias voltage from 3 to 5 volts because the current is negligibly small when the bias voltage is less than or equal to 2 volts. The measurement shows that the current increases linearly as the laser power increases over the threshold pump power of 270 pW or less.

Furthermore, we measured the current-laser power curves in the devices with and without a porous semiconductor (silicon) segment at a bias voltage of 5 volts. As the pump power increased from 0 to 9.4 nW, the device without porous semiconductor (silicon) segment showed an extremely small current increase from 0.2 to 1.2 pA. In contrast, as the pump power increased from 0 to 9.4 nW, a significant current increase from 0.1 to 88 pA was observed in the device including the porous semiconductor (silicon) segment. This control experiment clearly shows that the photon-triggered current is generated only in the porous semiconductor (silicon) segment.

Figure 6A:
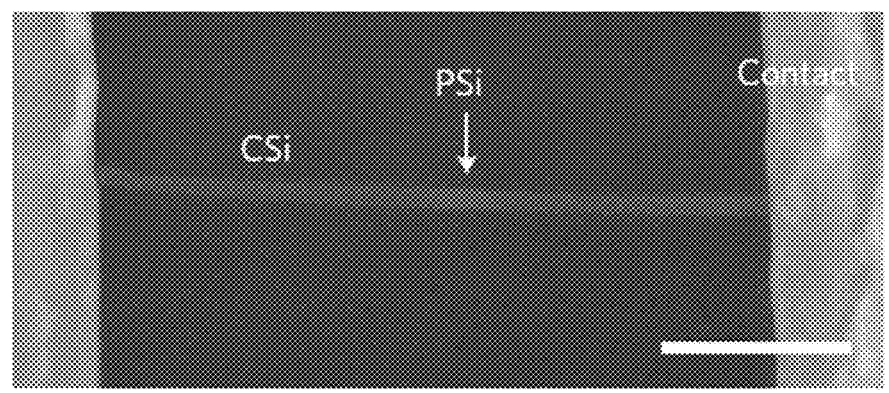
FIGS. 6A through 6C illustrate a nanowire device according to another example embodiment of the present disclosure and experiment results.
Figure 6B:
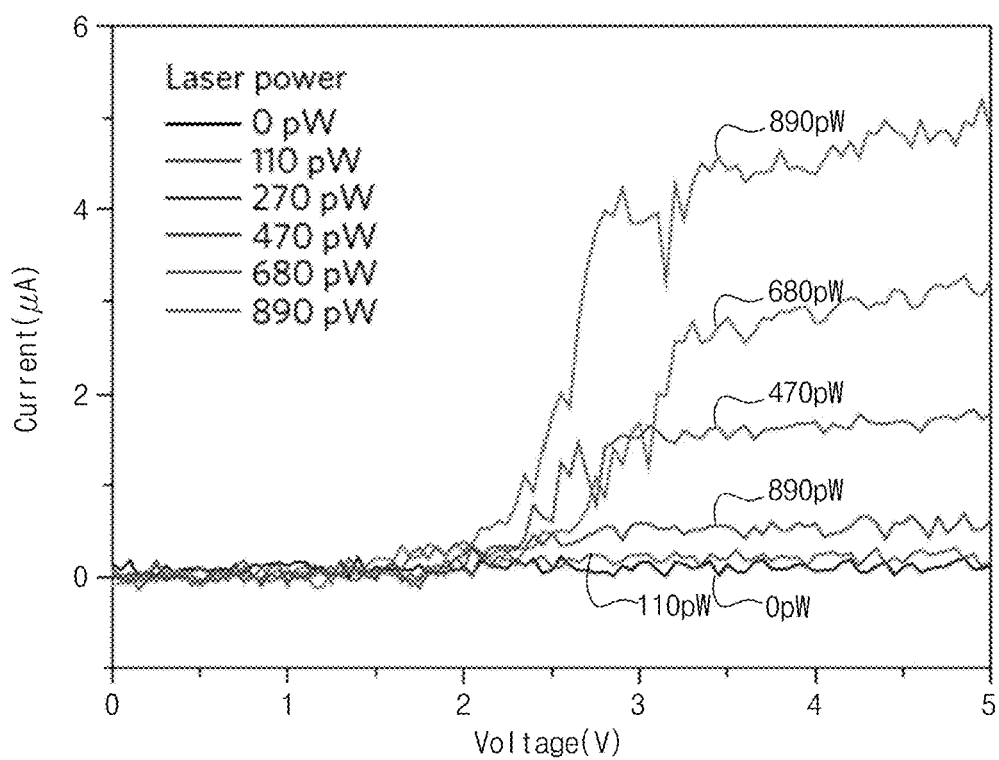
Figure 6C:
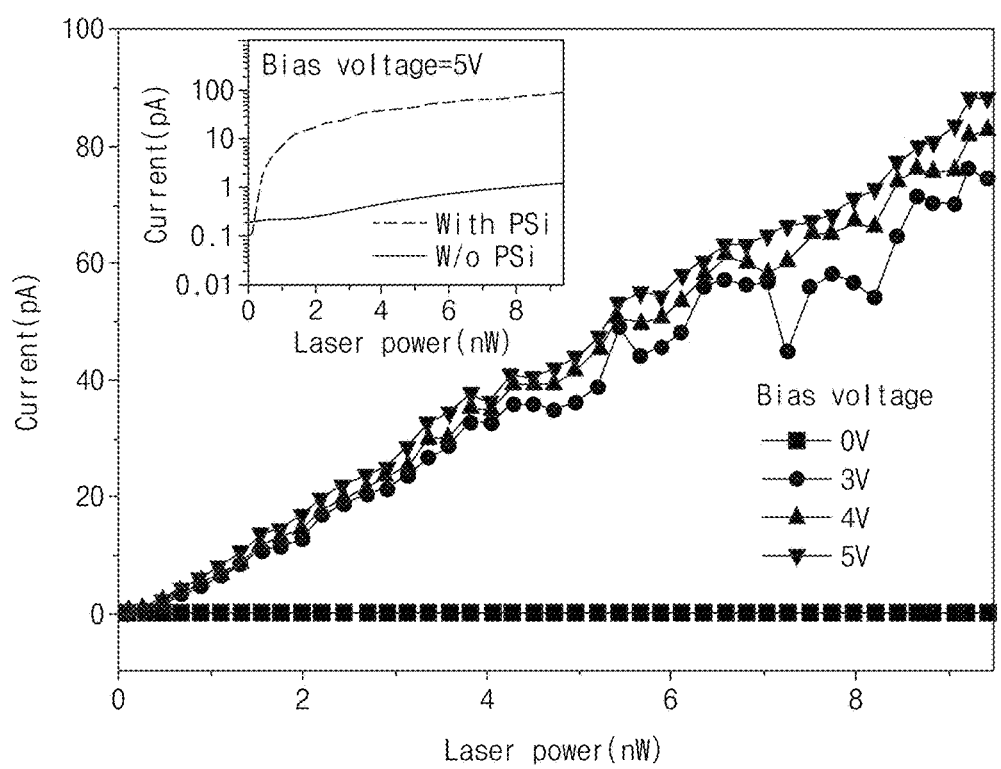

FIGS. 6A through 6C illustrate a nanowire device according to another example embodiment of the present disclosure and experiment results.

FIG. 6A is an SEM image of a small-diameter semiconductor nanowire device. A diameter of a nanowire is 25 nm, and a length of a porous semiconductor (silicon) segment is 100 nm.

FIG. 6B shows measured I-V curves in the small-diameter semiconductor nanowire device. The laser pump power ranged from 0 to 890 pW. A measurable current is detected only for laser powers larger than or equal to 270 pW.

FIG. 6C shows measured current versus laser pump power. Currents were measured for the case where bias voltages are 0 volt, 3 volts, 4 volts, and 5 volts, respectively.

The same feature is observed in the nanowire device having a diameter of 180 nm. Although the measured current in the nanowire device having a diameter of 25 nm is smaller than that of the nanowire device having a diameter of 180 nm, the nanowire device having a diameter of 25 nm is significantly more sensitive to the weaker light with a power of about 270 pW or more.

FIGS. 7A through 7G illustrate a high-resolution single semiconductor nanowire photodetection system according to an example embodiment of the present disclosure and experiment results.

Figure 7A:
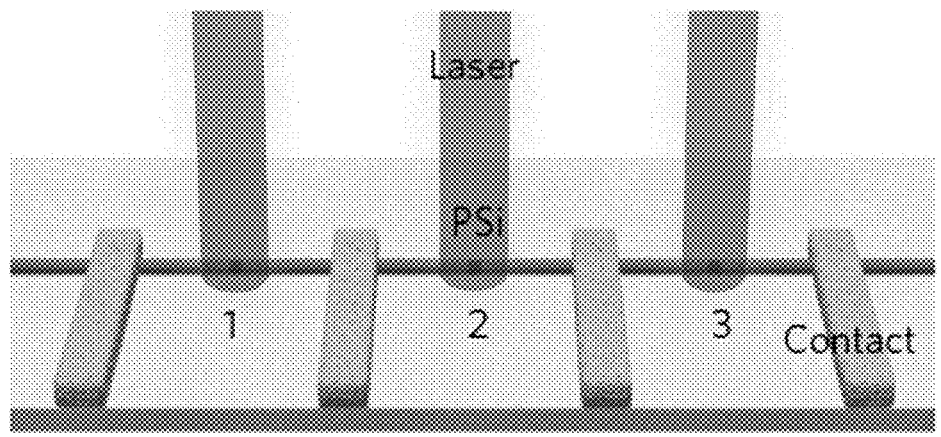
FIGS. 7A through 7G illustrate a high-resolution single semiconductor nanowire photodetection system according to an example embodiment of the present disclosure and experiment results.

FIG. 7A is a schematic diagram of a photodetection system. Metal contacts were introduced between porous semiconductor (silicon) segments 1, 2, and 3 in a single semiconductor (silicon) nanowire. A pump laser was focused on one porous semiconductor (silicon) segment at one time.

Figure 7B:
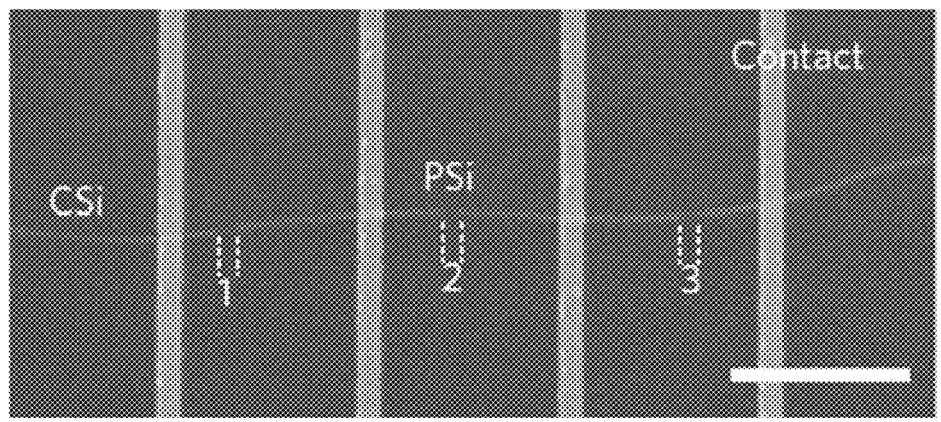

FIG. 7B is an SEM image of the photodetection system. Positions of the three porous semiconductor (silicon) segments were denoted by white dotted lines. A diameter of the nanowire was 25 nm, and a distance between adjacent metal contacts is 1 μm.

Figure 7C:
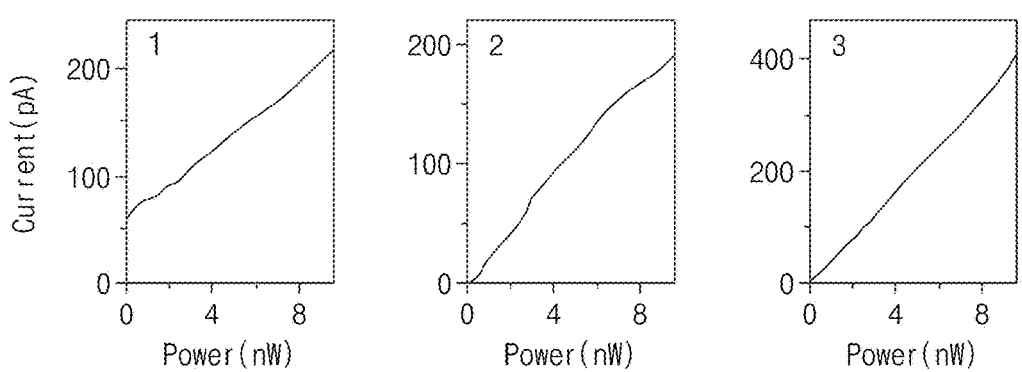

FIG. 7C shows current-laser output curves of an individual device including porous silicon segments 1 (left), 2 (center), and 3 (right) at a bias voltage of 5 volts.

Figure 7D:
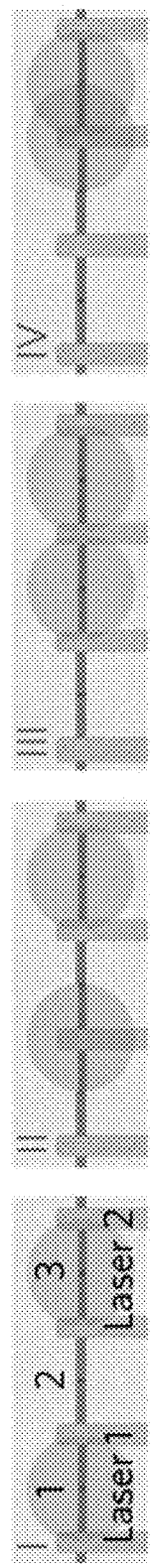

FIG. 7D shows positions of two pump laser (Laser 1 and Laser 2). Laser 1 was initially disposed on porous semiconductor (silicon) segment 1 (pixel 1) and scanned to the right across porous semiconductor (silicon) segment 2 (pixel 2), whereas Laser 2 remained positioned on porous semiconductor (silicon) segment 3 (pixel 3). We examined four different laser pumping cases, I to IV. A scan step size of the laser 1 is 500 nm. The power of the Laser 1 and the Laser 2 are 10 nW. Four different laser pumping cases, I to IV are shown.

Figure 7E:
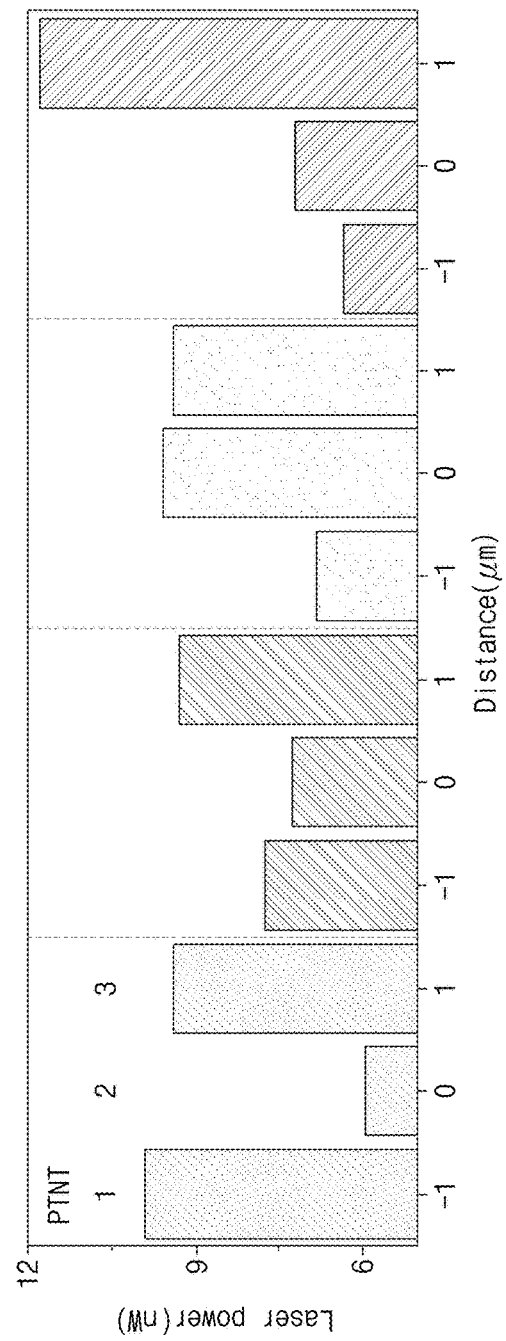

FIG. 7E shows, for each pumping case of (d), laser powers calibrated from the currents measured at porous silicon segments 1, 2 and 3. A measurement result of (c) was used as reference data for calibrating the laser power at the measured current. Only in the pixel 3 of the fourth pumping case, there is the laser power calibrated by extrapolating the reference data of (c).

Figure 7F:
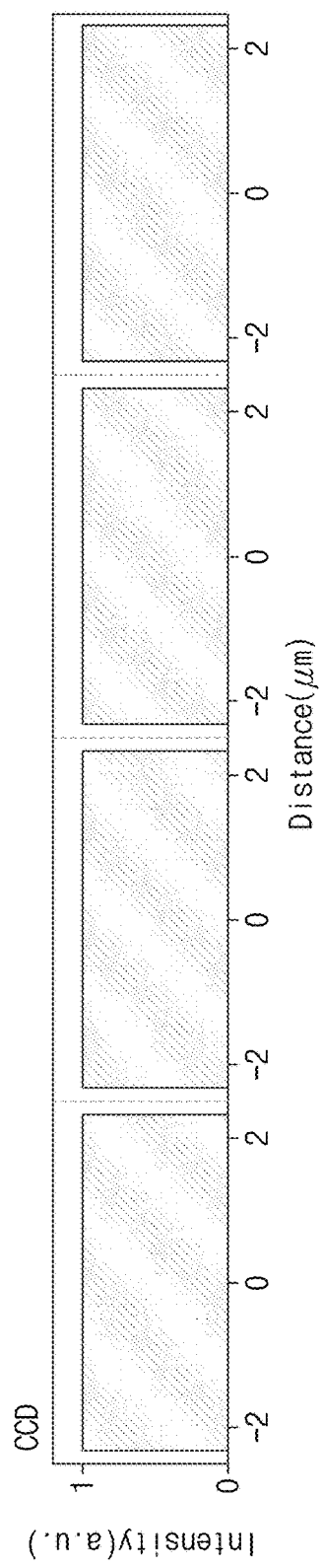

FIG. 7F shows normalized pumping intensities of two pump lasers measured by a typical CCD having a pixel size of 4.65 The four pumping cases of (d) were examined. In this example, change in intensity was not observed in any one of the four cases.

Figure 7G:
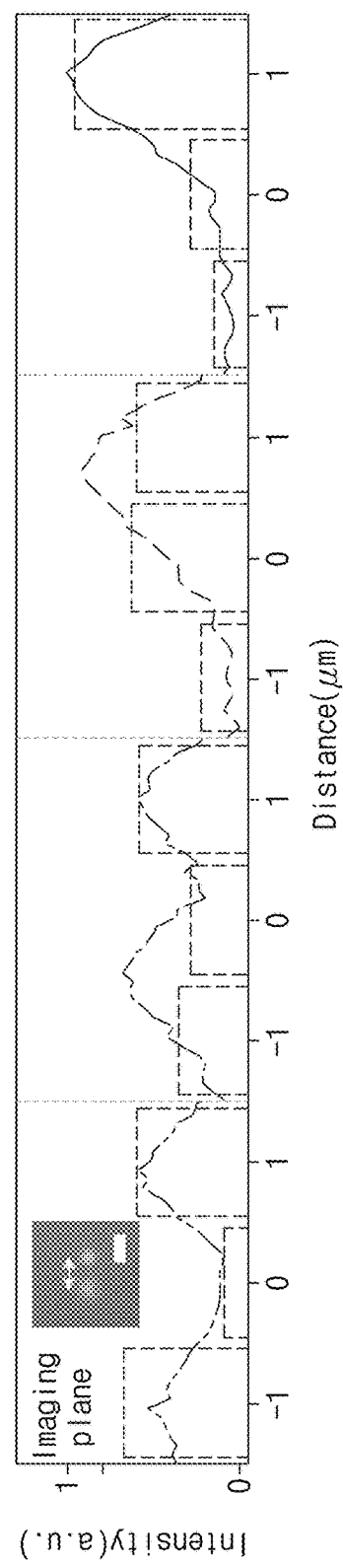

FIG. 7G shows measured intensity profiles of two pump lasers by using an imaging system. The image of the laser spots was magnified 50 times by an objective lens. The four pumping cases of (d) were measured again.

To take full advantage of the high photosensitivity of small-diameter semiconductor nanowires, a high-resolution photodetection system including three porous semiconductor (silicon) segments acting as three pixels was manufactured. The pump laser was focused on one porous semiconductor (silicon) segment where a nanowire device acts as a single pixel for the photodetection system.

FIG. 7B shows the SEM image of the nanowire device including three porous segments labeled 1, 2 and 3 that correspond to three independent pixels.

The CW pump laser was focused onto the porous silicon segment with varying pump power. We measured the current-laser power curves for the nanowire device including porous silicon segments 1, 2 and 3 to examine the photoresponse features of the individual nanowire devices. The measured currents from the nanowire devices were linearly proportional to the power of the pump laser. However, the current-laser power curves differ between the different devices. As a result, each device may be calibrated as a function of laser power.

Next, to access a nanowire photodetection system that includes three nanowire devices having a spacing of 1 μm, an experiment was performed to distinguish two closely located laser spots. Two pump lasers (Laser 1 and Laser 2) having spot sizes of 1 μm were disposed onto the device. The Laser 1 was initially disposed on a porous silicon segment 1 (pixel 1) and scanned to the right across porous silicon segment 2 (pixel 2), whereas the Laser 2 remained disposed on a porous silicon segment 3 (pixel 3). We examined four different laser pumping cases I to IV. For each pumping case, we measured the currents at porous silicon segments 1, 2 and 3 and then calibrated them to laser powers using the reference data. The measured laser powers for each pixel show that the nanowire photodetection system successfully recorded and precisely distinguished the positions and powers of the pump lasers with a spatial resolution less than 1 μm.

For comparison, an identical experiments was performed using a conventional silicon charge-coupled device (CCD) having a pixel size of 4.65 μm. The pump lasers were indistinguishable because of the poor spatial resolution of the CCD. In addition, the intensity profiles of the two pump lasers were measured using an imaging system. The pumping conditions were the same as those shown in FIG. 7(b), but the image of the laser spots was magnified 50 times by an objective lens. The measurement results are similar to the results obtained using the nanowire photodetection system, except for the regions obscured by the metal contacts.

Therefore, our high-sensitivity, high-resolution photodetection system showed the exact value of an incident light power at each pixel, without the usage of additional optical components. In summary, the nanowire devices provide a promising and simple approach to the demonstration of multifunctional nanodevices.

Figure 8:
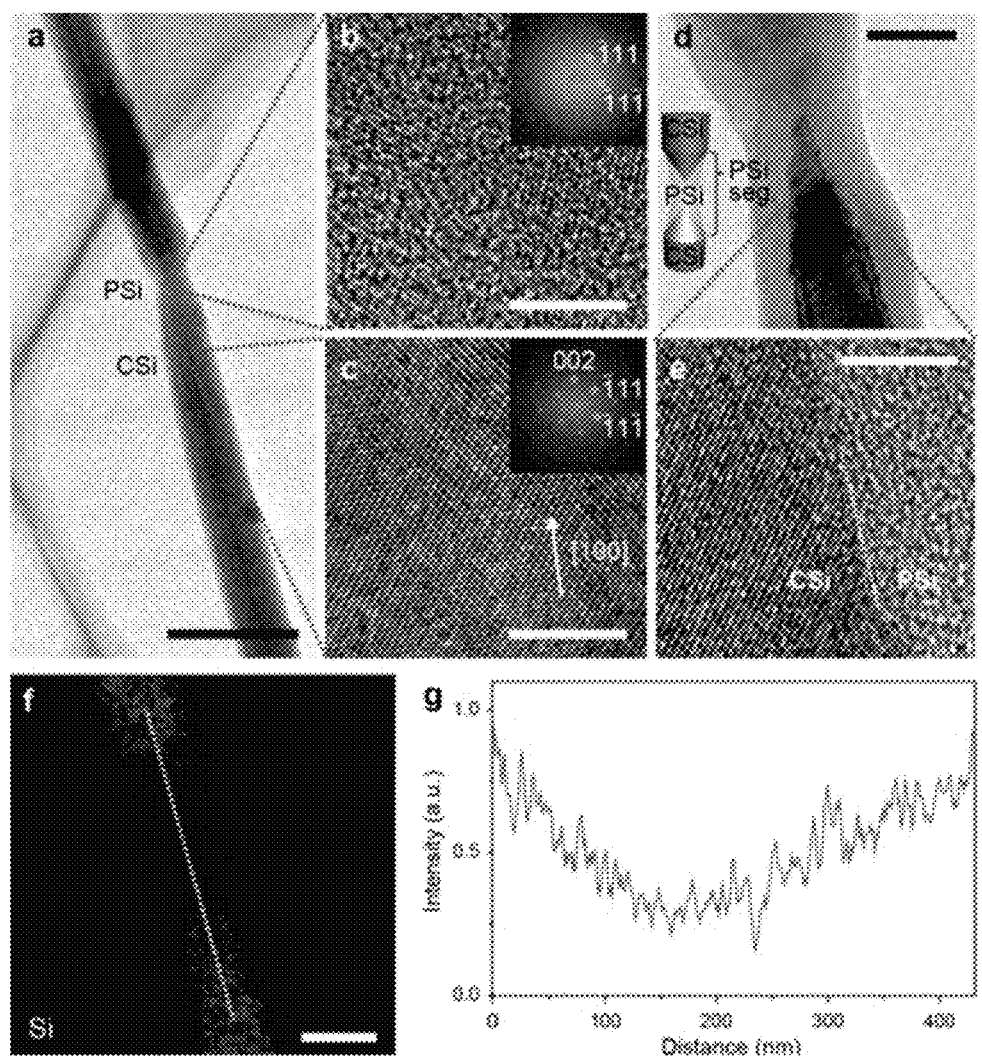
FIG. 8 shows TEM images of a semiconductor nanowire including a single porous semiconductor segment according to an example embodiment of the present disclosure.

FIG. 8 shows TEM images of a semiconductor nanowire including a single porous semiconductor segment according to an example embodiment of the present disclosure.

FIG. 8(a) shows a scanning TEM image of a semiconductor nanowire having a diameter of 200 nm which includes a single porous semiconductor segment.

FIG. 8(b) shows a high-resolution TEM image where a porous semiconductor segment extends.

FIG. 8(c) shows a high-resolution TEM image where a crystal semiconductor segment extends. A single crystal of silicon was observed at the crystal semiconductor segment. Meanwhile, nanoscale crystal lattices surrounded pores and were observed at the porous semiconductor segment. A typical FFT pattern of silicon indicates that a crystallographic orientation of the semiconductor nanowire is [100] on the [110] zone axis.

FIG. 8(d) shows a TEM image of the porous semiconductor segment and the crystal semiconductor segment. A strong contrast was observed between the crystal semiconductor segment and the porous semiconductor segment. A porous semiconductor area was larger in the center of the porous semiconductor segment. A local structure change of the porous semiconductor segment had no influence on a device because an incident pump laser spot is greater than an entire area of the porous semiconductor segment.

FIG. 8(e) shows a high-resolution TEM image indicating an interface of the porous semiconductor segment and the crystal semiconductor segment.

FIG. 8(f) shows an energy-dispersive X-ray spectroscopy (EXD) silicon mapping image taken in the vicinity of the porous semiconductor segment. A weak color concentration was observed at the porous semiconductor segment.

FIG. 8(g) shows a normalized EDX-integrated signal profile of silicon at the porous semiconductor segment. This is obtained through line scan of white dotted lines of (f). Silicon elements were reduced to reach a minimum (30 percent or less) in the center of the porous semiconductor segment, which indicates that a porosity of the silicon is 70 percent or less in the center of the porous semiconductor segment.

FIGS. 9A through 9D illustrate structure analysis and modeling of a band structure of a porous semiconductor segment according to an example embodiment of the present disclosure.

Figure 9A:
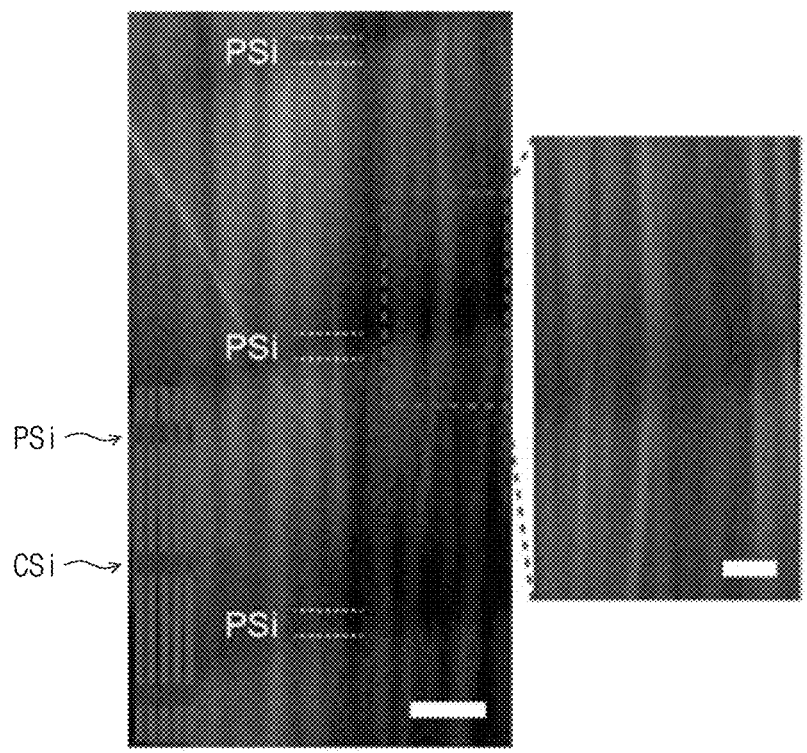
FIGS. 9A through 9D illustrate structure analysis and modeling of a band structure of a porous semiconductor segment according to an example embodiment of the present disclosure.

FIG. 9A shows an SEM image and an SEM image of a semiconductor nanowire bundle including three porous semiconductor segments. A diameter of the semiconductor nanowire was 25 nm, and a length of each porous semiconductor segment (white dotted line) is 100 nm.

Figure 9B:
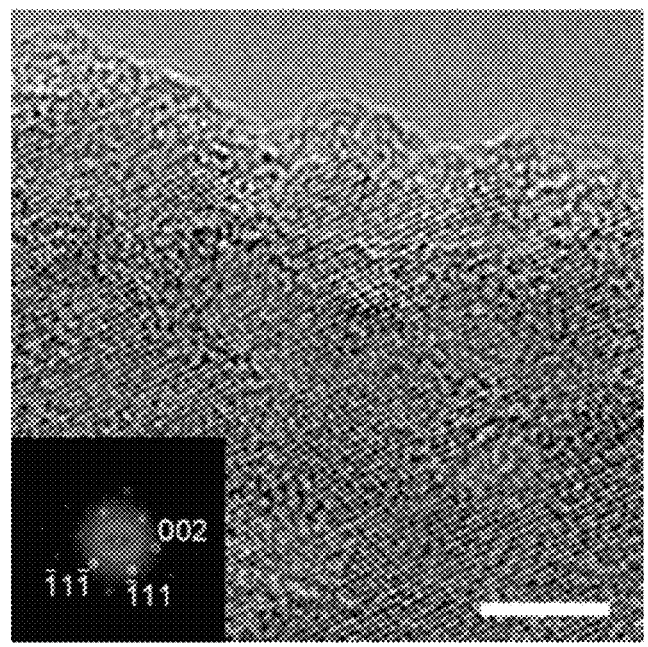

FIG. 9B shows an HR-TEM image of a porous semiconductor segment. Nano-sized crystal lattices surrounded pores and were observed. FET patterns of the porous semiconductor segment were shown on the [110] zone axis.

Figure 9C:
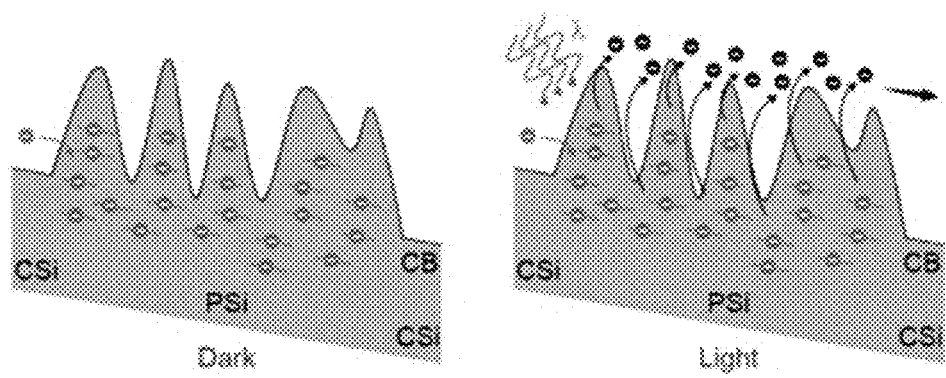

FIG. 9C is a conceptual diagram of a semiconductor nanowire including a single porous semiconductor segment under dark (left) and bright (right) conditions. An electronic structure of crystal silicon (CSi) is essentially different from that of a porous semiconductor. A porous semiconductor includes nanoscale silicon lattices surrounding a pore. An electronic structure of crystal structure is similar to that of bulk silicon having a well-defined bandgap. However, an electronic structure of the porous semiconductor was more complex and exhibited a wider electronic gap due to quantum confinement effect of nanocrystals. In the dark, injected carriers were trapped in a local state of the porous semiconductor segment and a current was blocked. When a light impinged on the porous semiconductor segment, trapped electrons were excited to a higher electron state and triggered a current flowing across an electrode.

Figure 9D:
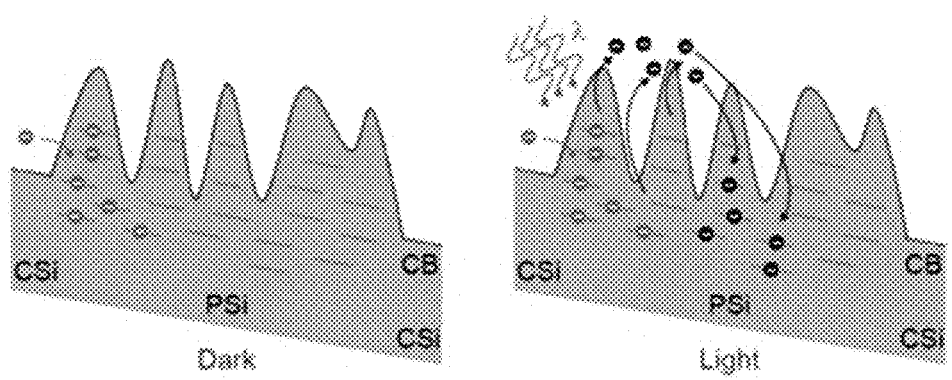

FIG. 9D is a conceptual diagram of a band diagram of a small-diameter semiconductor nanowire including a single porous semiconductor segment at a low bias voltage under dark (left) and bright (right) conditions. Localized states of the porous semiconductor segments were partially occupied because the number of injected electrons is small. Next, the optically excited electrons were re-trapped to the localized states.

Figure 10:
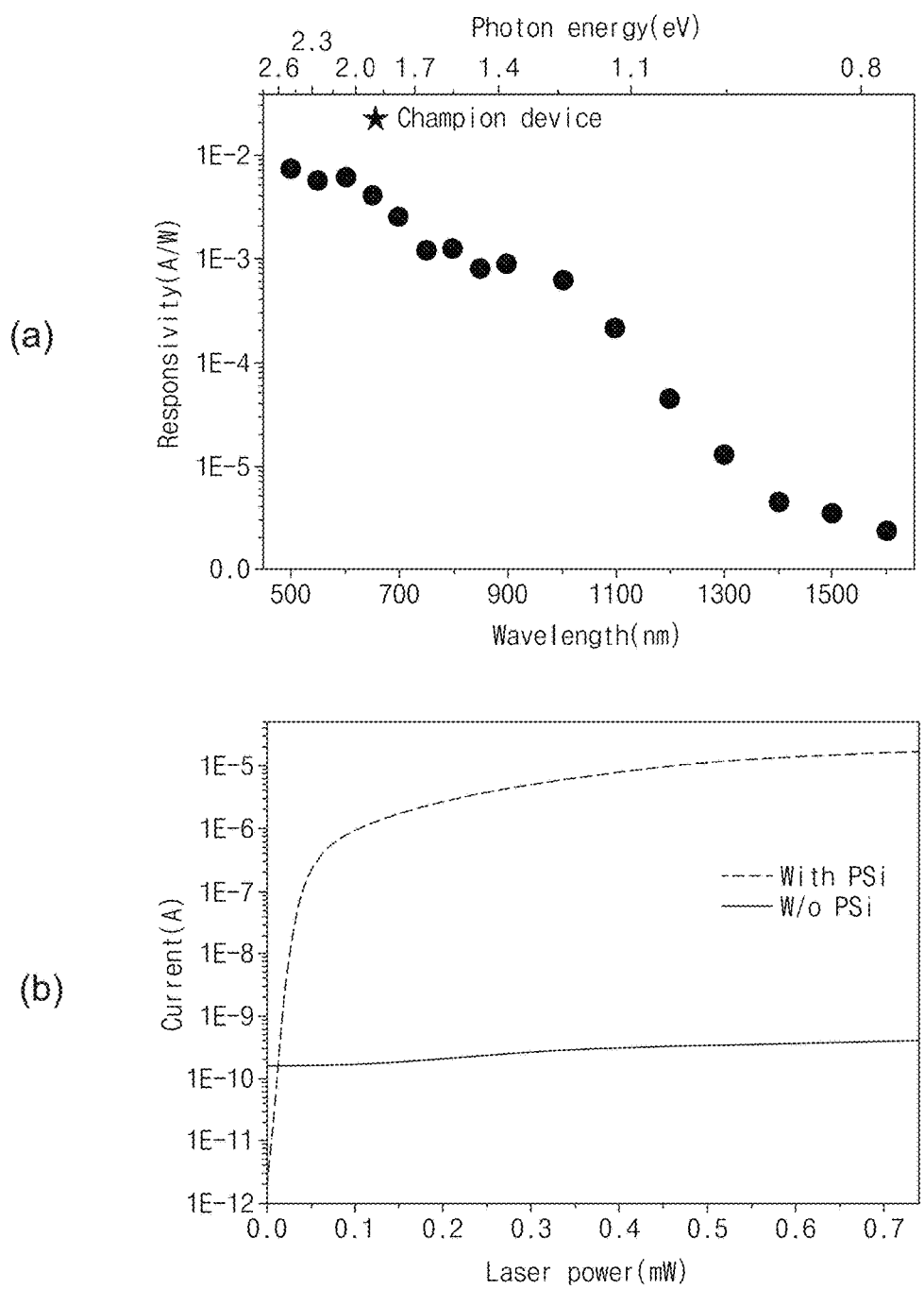
FIG. 10 illustrates wavelength-dependent responsivity and characteristics of a semiconductor nanowire device depending on whether there is a porous semiconductor segment according to an example embodiment of the present disclosure.

FIG. 10 illustrates wavelength-dependent responsivity and characteristics of a semiconductor nanowire device depending on whether there is a porous semiconductor segment according to an example embodiment of the present disclosure.

FIG. 10(a) shows a log-scale plot of a current normalized with responsivity and pump power as an incident wavelength of the pours semiconductor segment at a bias voltage of 5 volts. This device included a semiconductor nanowire having a diameter of 200 nm and a porous semiconductor segment having a length of 400 nm. A supercontinuum laser having a wide wavelength range from 500 nm to 1,600 nm was used as a pumping light source. The longer the incident wavelength, the smaller a resulting responsivity. Wavelength-dependent current generation may be interpreted by a wide-range energy level for a trap state. For example, in the case of a shorter pumping wavelength, a greater current was measured because electrons trapped at the wide-range energy level were excited to a higher electron state. However, in the case of a longer pumping wavelength, a smaller current was measured because only electrons trapped at a narrow-range energy level are excited. In particular, a current may be measured even when a wavelength is between 1100 and 1600 nm which is lower than the bandgap. We estimated that activation energy of a trap state is smaller than 0.78 eV.

FIG. 10(b) shows a log-scale plot of current-laser power in a semiconductor nanowire device having a diameter of 180 nm depending on whether there is a porous semiconductor segment at a bias voltage of 5 volts. A length of the porous semiconductor segment was 450 nm. A wavelength of the CW pump laser was 658 nm. Under the lighting, a device with the porous semiconductor segment exceeded a current of a device without the porous semiconductor segment. Since the electrons trapped at the wide-range energy level were simultaneously excited a higher electron state, significant current increase occurs at the porous semiconductor segment.

Considering a resistivity of a wafer used to synthesize a semiconductor nanowire, a semiconductor nanowire diameter of 180 nm, a semiconductor nanowire length of 8 μm, the semiconductor nanowire current without the porous semiconductor segment was estimated to be 300 nA or less for the bias voltage of 5 volts. The measured current was much lower than a calculated value. This was interpreted to result from a non-ideal ohm contact, surface depletion effect, and improve carrier dispersion caused by surface roughness of a semiconductor nanowire.

Figure 11:
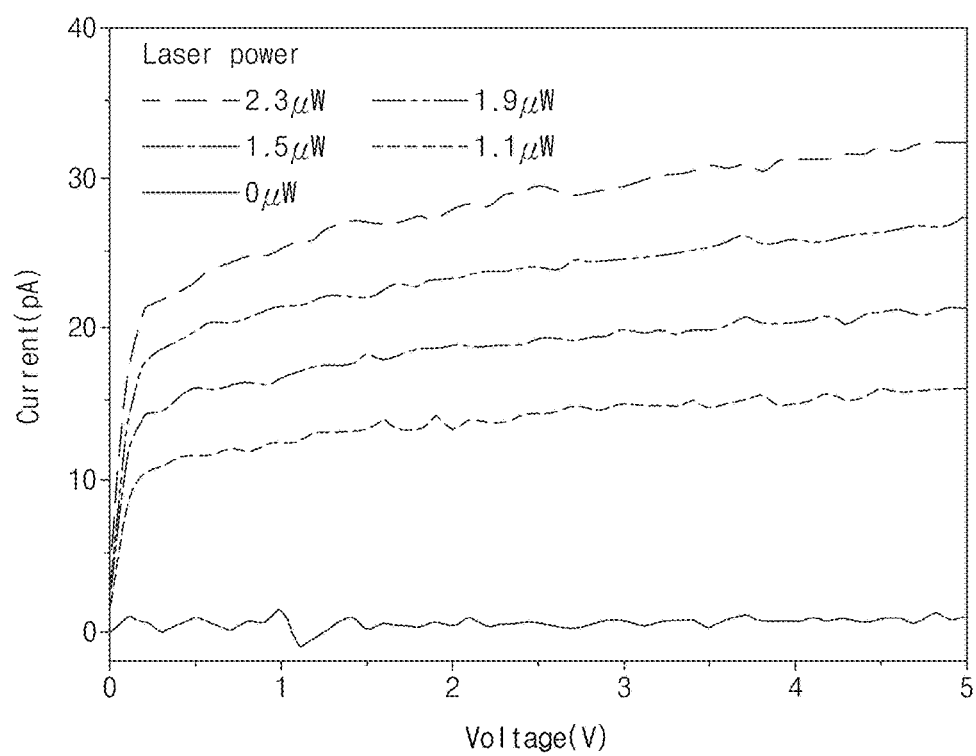
FIG. 11 shows measured I-V curves in a device according to an example embodiment of the present disclosure by 1550 nm laser pumping.

FIG. 11 shows measured I-V curves in a device according to an example embodiment of the present disclosure by 1550 nm laser pumping.

Referring to FIG. 11, a device having a semiconductor nanowire diameter of a 200 nm is optically pumped using a CW laser having a wavelength of 1550 nm at room temperature. A laser was focused to a spot size of 1 μm or less on a semiconductor nanowire device using an objective lens of 50 magnification with a numerical aperture (NA) of 0.42. Pumping power varied from 0 to 2.3 W. A current was measured even when photon energy is smaller than a bandgap of silicon. This strongly suggested that the current was generated not by conventional interband change separation but by photon trigger of electrons trapped at the porous semiconductor segment.

Figure 12:
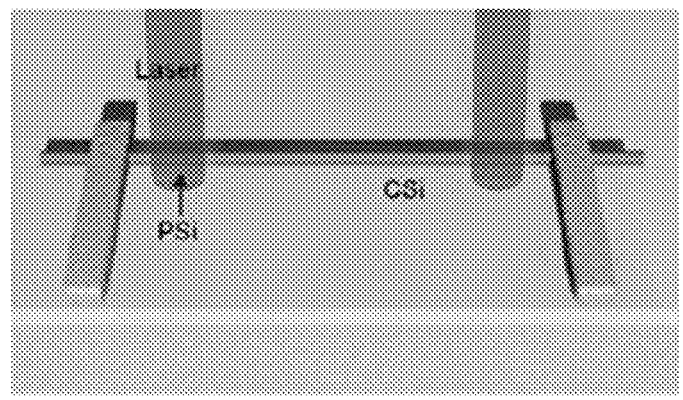
FIG. 12 shows a current measured in a long semiconductor nanowire including a single porous semiconductor segment according to another example embodiment of the present disclosure.
Figure 12:
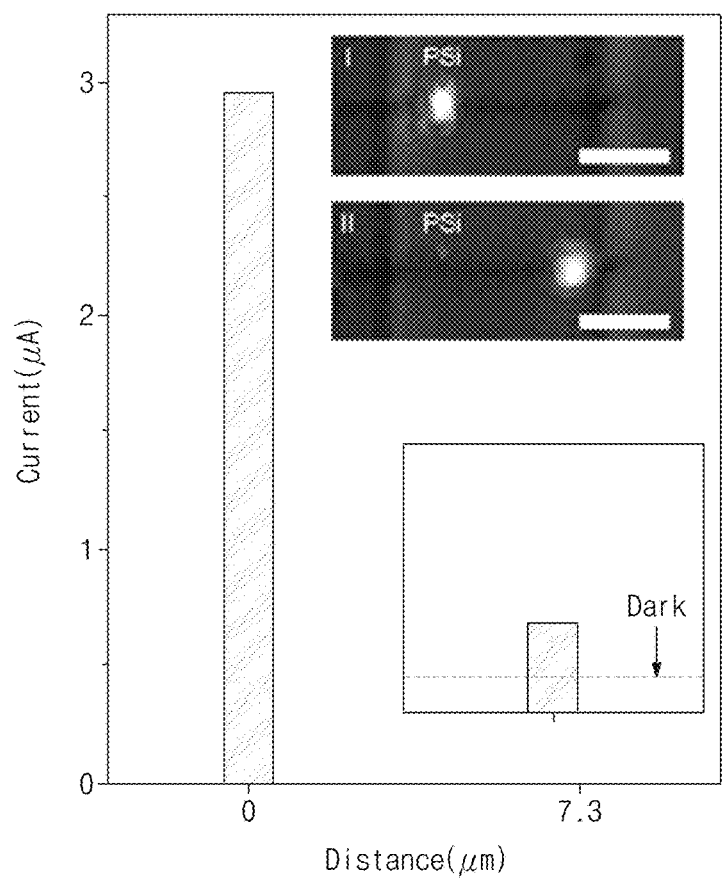

FIG. 12 shows a current measured in a long semiconductor nanowire including a single porous semiconductor segment according to another example embodiment of the present disclosure.

FIG. 12(a) is a schematic diagram of measurement procedure. A 658 nm CW pump laser having a spot size of 1 μm was irradiated to a porous semiconductor segment or a crystal semiconductor segment of a long semiconductor nanowire. Since the pump laser was sufficiently spaced apart from a porous semiconductor segment area when a crystal semiconductor segment area, the effect of the pump laser for the porous semiconductor segment was maximized.

FIG. 12(b) shows currents measured in the porous semiconductor segment (@ 0 μm) and the crystal semiconductor segment area (@ 7.3 μm) at the bias voltage of 5 volts. A diameter of the semiconductor nanowire was 200 nm, and power of the pump laser was 0.85 mW. A current measured in a crystal semiconductor area spaced apart from the porous semiconductor segment by 7.3 μm is separately shown.

Dotted lines indicate a current measured when the pump laser is turned off. A ratio of the two currents measured in the porous semiconductor segment and the crystal semiconductor segment is $2 \times 10^5$ or less.

Figure 13:
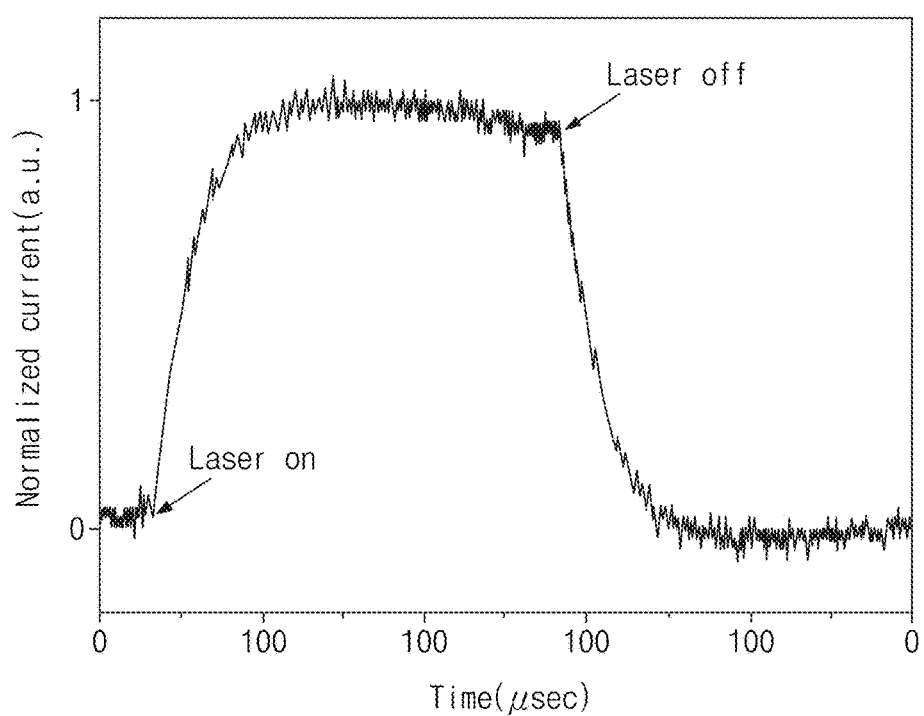
FIG. 13 shows a transient current in a semiconductor nanowire device according to another example embodiment of the present disclosure.

FIG. 13 shows a transient current in a semiconductor nanowire device according to another example embodiment of the present disclosure.

Referring to FIG. 13, a normalized transient current of a device is shown when a pulse laser is injected into a porous semiconductor segment. A laser pulse was generated using a pulse generator to modulate a laser diode. Pulse width, spacing, and peak power of a pump laser were 250 μs, 500 μs, and 0.74 mW, respectively. A bias voltage is 5 volts. Rising/falling times were measured to be 28 μs. Even when a distance between metal contacts of the semiconductor nanowire changed from 8μ to 1 μm, a similar optical response time was measured.

Figure 14:
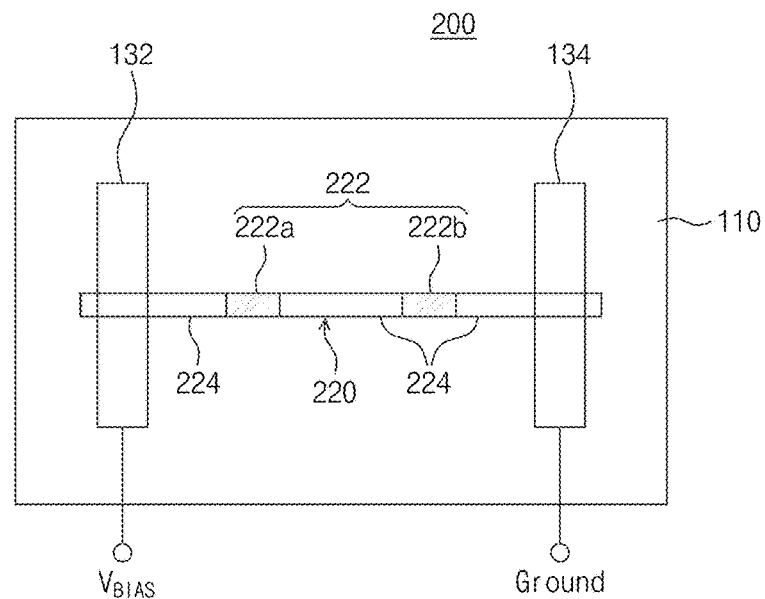
FIG. 14 illustrates a semiconductor nanowire device according to another example embodiment of the present disclosure.

FIG. 14 illustrates a semiconductor nanowire device according to another example embodiment of the present disclosure.

Referring to FIG. 14, a semiconductor nanowire device 200 includes a semiconductor nanowire 220 doped with a dopant of a first conductivity type and including semiconductor segments 224 which include at least one porous semiconductor segment 222 and are connected to opposite ends of the porous semiconductor segment 222; and a first electrode 132 and a second electrode 134 respectively disposed in the crystal semiconductor segments 224 around the porous semiconductor segment 222 to provide an electrical connection. The crystal semiconductor segment 224 may include a crystal semiconductor, and the porous semiconductor segment 222 may include a porous semiconductor. When an external light is irradiated to the porous semiconductor segment 222, the semiconductor nanowire 220 provides a current according to the intensity of the external light.

The semiconductor nanowire 220 may include a first porous semiconductor segment 222a and a second porous semiconductor segment 222b which are spaced apart from each other. The first porous semiconductor segment 222a and the second porous semiconductor segment 222b may be connected to each other by the crystal semiconductor segment 224. The first electrode 132 and the second electrode 134 are disposed at opposite ends of the semiconductor nanowire 220, respectively. The first electrode 132 may apply a constant bias voltage, and the second electrode 134 may be grounded. When a first light is irradiated to the first porous semiconductor segment 222a and a second light is irradiated to the second porous semiconductor segment 222b and only when both the first light and the second light are irradiated, a current may flow to the semiconductor nanowire 220. Thus, the semiconductor nanowire device 200 may operate as an AND logic circuit.

The semiconductor nanowire 220 may be a silicon nanowire. A porosity of the porous semiconductor segment 222 may be between 50 and 80 percent. In the semiconductor nanowire 2220, a diameter of the porous semiconductor segment 222 may be smaller than or equal to that of the crystal semiconductor segment 224. A diameter of the semiconductor nanowire 220 may be between 20 and 220 nm, and a length of the porous semiconductor segment 222 may be between 10 and 1200 nm. The first conductivity of the semiconductor nanowire 220 may be n-type, and a doping concentration of the n-type dopant may be between $10^{15}$/cm$^3$ and $10^{19}$/cm$^3$.

Figure 15:
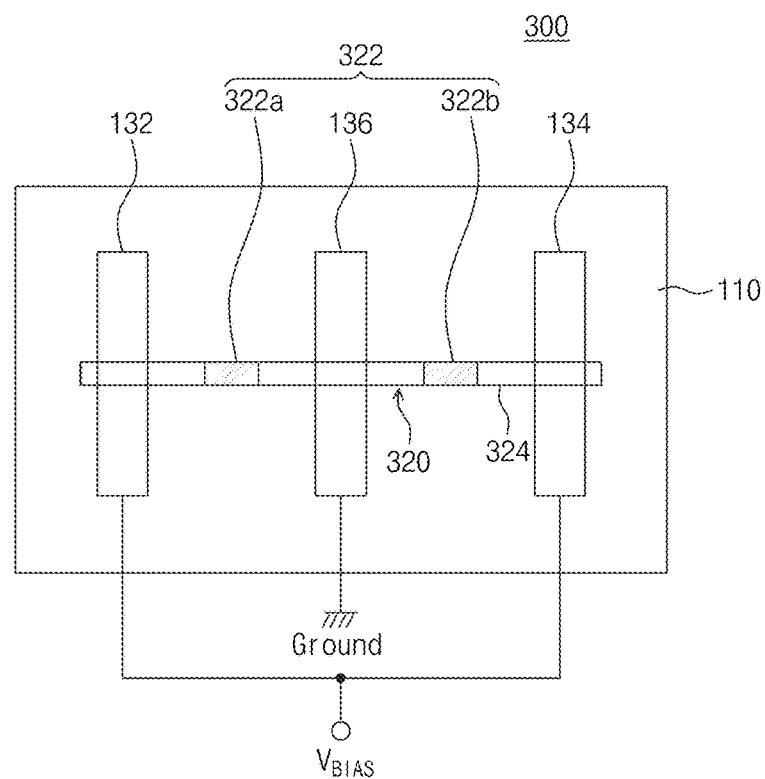
FIG. 15 illustrates a semiconductor nanowire device according to another example embodiment of the present disclosure.

FIG. 15 illustrates a semiconductor nanowire device according to another example embodiment of the present disclosure.

Referring to FIG. 15, a semiconductor nanowire device 300 includes a semiconductor nanowire 320 doped with a dopant of a first conductivity type and including semiconductor segments 324 which include at least one porous semiconductor segment 322 and are connected to opposite ends of the porous semiconductor segment 322; and a first electrode 132 and a second electrode 134 respectively disposed in the crystal semiconductor segments 324 around the porous semiconductor segment 322 to provide an electrical connection. The crystal semiconductor segment 324 may include a crystal semiconductor, and the porous semiconductor segment 322 may include a porous semiconductor. When an external light is irradiated to the porous semiconductor segment 322, the semiconductor nanowire 320 provides a current according to the intensity of the external light.

The semiconductor nanowire 320 may include a first porous semiconductor segment 322a and a second porous semiconductor segment 322b which are spaced apart from each other. The first porous semiconductor segment 322a and the second porous semiconductor segment 322b may be connected to each other by the crystal semiconductor segment 324. The first electrode 132 and the second electrode 134 are disposed at opposite ends of the semiconductor nanowire 320, respectively. A third electrode 136 may be disposed on the crystal semiconductor segment disposed between the first porous semiconductor segment 322a and the second porous semiconductor segment 322b. The first electrode 132 and the second electrode 134 may be connected to each other to apply a constant bias voltage. The third electrode 136 may be grounded. A first light may be irradiated to the first porous semiconductor segment 322a, and a second light may be irradiated to the second porous semiconductor segment 322b. Thus, when both the first light and the second light are irradiated, a highest current may flow. When only one of the first and second lights is irradiated, a middle-level current may flow. When no light is irradiated, a current may not flow. Thus, the semiconductor nanowire device 300 may constitute an OR logic circuit.

Figure 16:
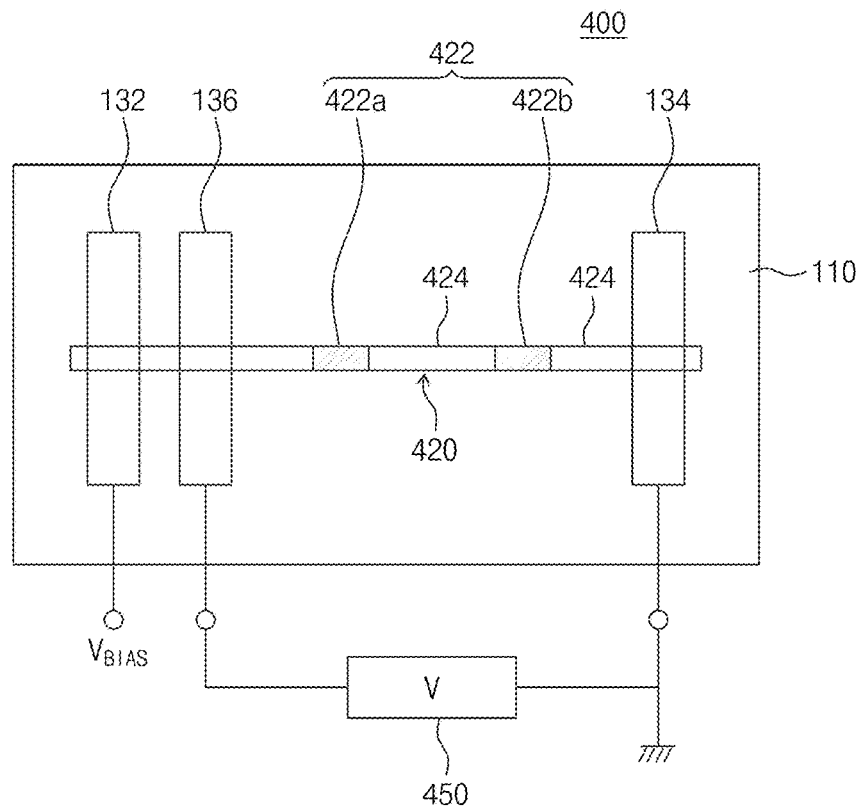
FIG. 16 illustrates a semiconductor nanowire device according to another example embodiment of the present disclosure.

FIG. 16 illustrates a semiconductor nanowire device according to another example embodiment of the present disclosure.

Referring to FIG. 16, a semiconductor nanowire device 400 includes a semiconductor nanowire 420 doped with a dopant of a first conductivity type and including semiconductor segments 424 which include at least one porous semiconductor segment 422 and are connected to opposite ends of the porous semiconductor segment 422; and a first electrode 132 and a second electrode 134 respectively disposed in the crystal semiconductor segments 424 around the porous semiconductor segment 422 to provide an electrical connection. The crystal semiconductor segment 424 may include a crystal semiconductor, and the porous semiconductor segment 422 may include a porous semiconductor. When an external light is irradiated to the porous semiconductor segment 322, the semiconductor nanowire 420 provides a current according to the intensity of the external light.

The semiconductor nanowire 420 may include a first porous semiconductor segment 422*a* and a second porous semiconductor segment 422*b* which are spaced apart from each other. A third electrode 136 may be disposed between the first electrode 132 and the second electrode 134 to be adjacent to and spaced apart from the first electrode 132. The first porous semiconductor segment 422*a* and the second porous semiconductor segment 422*b* may not be disposed between the first electrode 132 and the third electrode 136. The first electrode 136 may apply a constant bias voltage, and the second electrode 134 may be grounded. The third electrode 136 may be connected to a voltage measuring circuit 450. A first light may irradiate the first porous semiconductor segment 422*a*, and a second light may irradiate the second porous semiconductor segment 422*b*. Only when both the first light and the second light operate, the voltage measuring circuit 450 may measure voltage reduction. Thus, the voltage reduction may be measured to constitute a NAND logic circuit.

Figure 17:
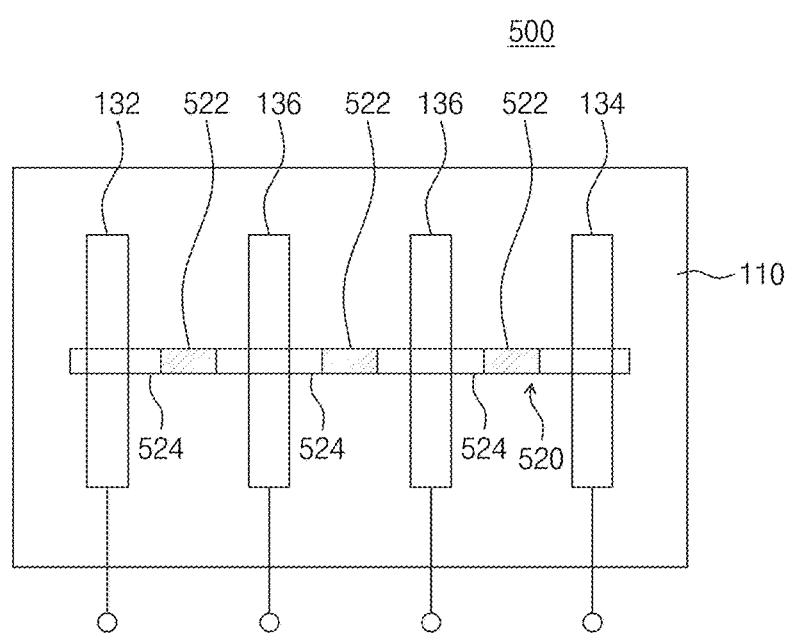
FIG. 17 illustrates a semiconductor nanowire device according to another example embodiment of the present disclosure.

FIG. 17 illustrates a semiconductor nanowire device according to another example embodiment of the present disclosure.

Referring to FIG. 17, a semiconductor nanowire device 500 includes a semiconductor nanowire 520 doped with a dopant of a first conductivity type and including semiconductor segments 524 which include at least one porous semiconductor segment 522 and are connected to opposite ends of the porous semiconductor segment 522; and a first electrode 132 and a second electrode 134 respectively disposed in the crystal semiconductor segments 524 around the porous semiconductor segment 522 to provide an electrical connection. The crystal semiconductor segment 524 may include a crystal semiconductor, and the porous semiconductor segment 522 may include a porous semiconductor. When an external light is irradiated to the porous semiconductor segment 522, the semiconductor nanowire 520 provides a current according to the intensity of the external light.

The porous semiconductor segment 522 may include a plurality of porous semiconductor segments. A plurality of third electrodes 136 may be disposed between adjacent porous semiconductor segments 522 to separate the porous semiconductor segments 522 from each other. When a bias voltage is applied between a pair of adjacent electrodes, a determination may be made as to whether an external light irradiates a porous semiconductor segment disposed between the pair of adjacent electrodes.

Figure 18A:
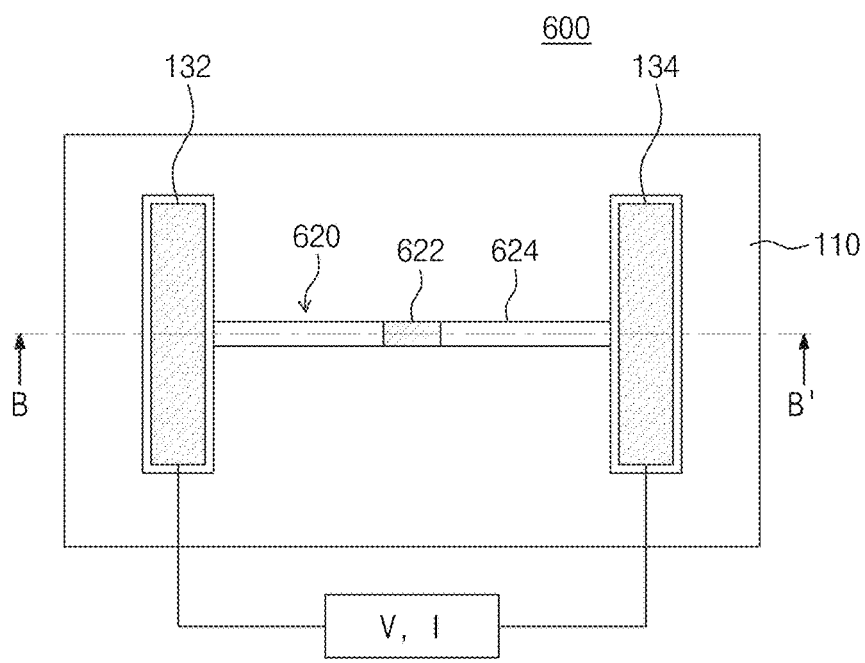
FIG. 18A is a top plan view of a semiconductor nanowire device according to another example embodiment of the present disclosure.

FIG. 18A is a top plan view of a semiconductor nanowire device according to another example embodiment of the present disclosure.

Figure 18B:
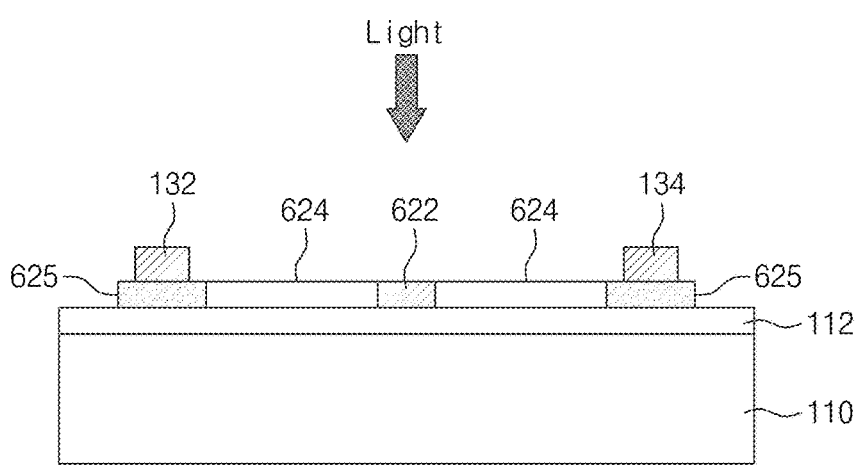
FIG. 18B is a cross-sectional view taken along the line B-B' in FIG. 18A.

FIG. 18B is a cross-sectional view taken along the line B-B' in FIG. 18A.

Referring to FIGS. 18A and 18B, a semiconductor nanowire device 600 includes a semiconductor nanowire 620 doped with a dopant of a first conductivity type and including semiconductor segments 624 which include at least one porous semiconductor segment 622 and are connected to opposite ends of the porous semiconductor segment 622; and a first electrode 132 and a second electrode 134 respectively disposed in the crystal semiconductor segments 624 around the porous semiconductor segment 622 to provide an electrical connection. The crystal semiconductor segment 624 may include a crystal semiconductor, and the porous semiconductor segment 622 may include a porous semiconductor. When an external light is irradiated to the porous semiconductor segment 622, the semiconductor nanowire 620 provides a current according to the intensity of the external light.

The semiconductor nanowire 620 may include a semiconductor contact region 625 directly connected to opposite ends of the semiconductor nanowire 620. The semiconductor contact region 625 may have a larger area than the crystal semiconductor segment 624. Each of the first and second electrodes 132 and 134 may be disposed on the semiconductor contact region 625. The semiconductor contact region 625 may include the same material as the semiconductor nanowire 620. However, a dopant-doping concentration of the semiconductor contact region 625 may be higher than that of a semiconductor nanowire corresponding to a channel region. Thus, the semiconductor contact region 625 may have similar characteristics to source/drain regions of a MOSFET.

Figure 19:
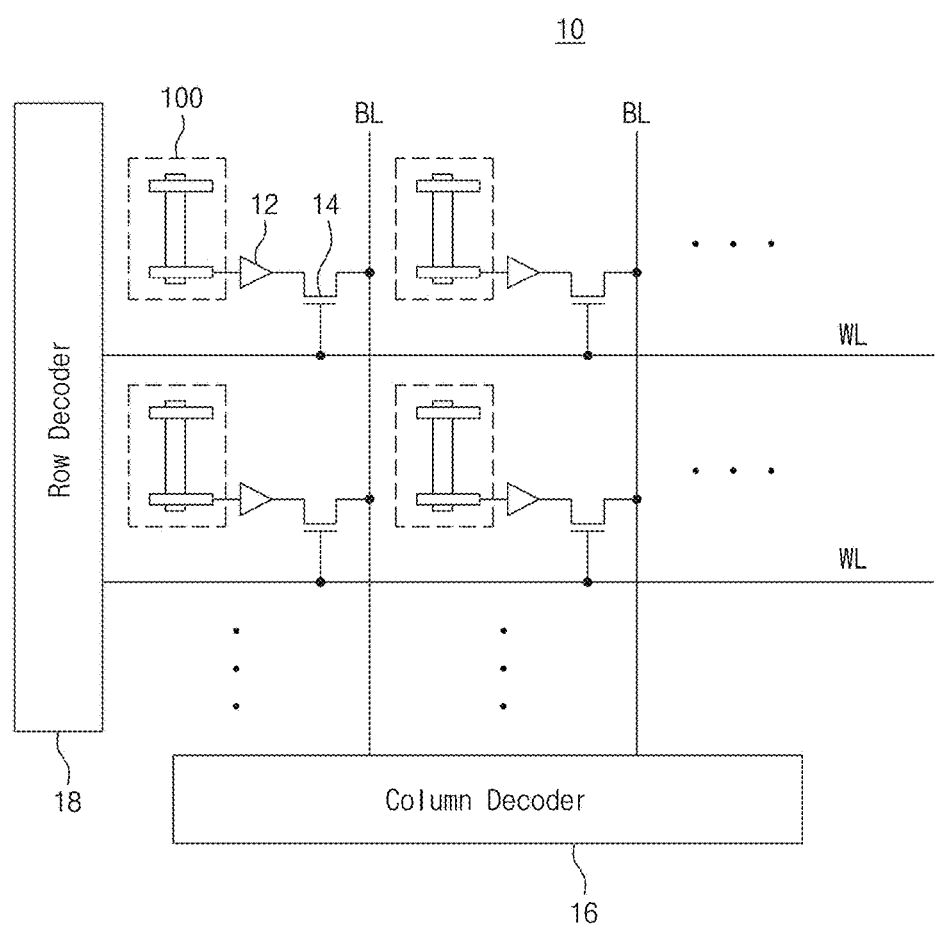
FIG. 19 illustrates a semiconductor nanowire image device according to an example embodiment of the present disclosure.

FIG. 19 illustrates a semiconductor nanowire image device according to an example embodiment of the present disclosure.

Referring to FIG. 19, a semiconductor nanowire image device 10 may include semiconductor nanowire devices 100 arranged on a semiconductor substrate 110 in a matrix format. Each of the semiconductor nanowire devices 100 includes a semiconductor nanowire 120 doped with a dopant of a first conductivity type and including semiconductor segments 124 which include at least one porous semiconductor segment 122 and are connected to opposite ends of the porous semiconductor segment 122; and a first electrode 132 and a second electrode 134 respectively disposed in the crystal semiconductor segments 124 around the porous semiconductor segment 122 to provide an electrical connection. The crystal semiconductor segment 124 may include a crystal semiconductor, and the porous semiconductor segment 122 may include a porous semiconductor. When an external light is irradiated to the porous semiconductor segment 122, the semiconductor nanowire 120 provides a current according to the intensity of the external light.

The first electrode 132 may be grounded, and the second electrode 134 may be connected to a source of a selection transistor 14 through an amplifier 12. A drain of the selection transistor 14 may be connected to a bitline BL, and the bitline BL may be connected to a column decoder 16. A gate of the selection transistor 14 may be connected to a wordline WL, and the wordline WL may be connected to a row decoder 18. Thus, a semiconductor nanowire device 100 disposed at a specific position may be selectively accessed.

As described above, in a photoelectric device according to an example embodiment of the present disclosure, more than ten million times amplification may be provided only by partially inserting a porous silicon area having a length of hundreds of nanometers into the center of a silicon nanowire and irradiating a light.

A photoelectric device according to an example embodiment of the present disclosure may effectively control an electrical signal by a light to significantly reduce conventional complex semiconductor design and manufacturing processes.

A photoelectric device according to an example embodiment of the present disclosure may operate as a logic circuit when a single silicon nanowire includes two porous silicon areas. The logic circuit makes it possible to develop a computer which is capable of performing a high-speed calculation using a light.

A photoelectric device according to an example embodiment of the present disclosure may provide a high-performance photodetector which is capable of detecting a very weak light with a high resolution of 1 micrometer or less by fabricating a nanowire transistor including a plurality of porous silicon areas.

Although the present disclosure and its advantages have been described in detail, it should be understood that various changes, substitutions and alterations can be made herein without departing from the spirit and scope of the disclosure as defined by the following claims.

What is claimed is:

1. A photoelectric semiconductor nanowire device comprising:
a semiconductor nanowire doped with a dopant of a first conductivity type and including crystal semiconductor segments which include at least one porous semiconductor segment and are connected to opposite ends of the porous semiconductor segment; and
a first electrode and a second electrode respectively disposed in the crystal semiconductor segments around the porous semiconductor segment to provide an electrical connection,
wherein the crystal semiconductor segment includes a crystal semiconductor,
wherein the porous semiconductor segment includes a porous semiconductor, and
wherein the semiconductor nanowire provides a current according to intensity of an external light when the external light is irradiated to the porous semiconductor segment.

2. The photoelectric semiconductor nanowire device as set forth in claim 1, wherein
the semiconductor nanowire includes silicon.

3. The photoelectric semiconductor nanowire device as set forth in claim 1, wherein
a porosity of the porous semiconductor segment is between 50 and 80 percent.

4. The photoelectric semiconductor nanowire device as set forth in claim 1, wherein
in the semiconductor nanowire, a diameter of the porous semiconductor segment is smaller than or equal to that of the crystal semiconductor segment.

5. The photoelectric semiconductor nanowire device as set forth in claim 1, wherein
the first electrode and the second electrode include at least one of Ti, Cr, Au, Pt, Pd, Al, Ag, and a combination thereof.

6. The photoelectric semiconductor nanowire device as set forth in claim 1, wherein
a diameter of the semiconductor nanowire is between 20 and 220 nm, and
a length of the porous semiconductor segment is between 10 and 1200 nm.

7. The photoelectric semiconductor nanowire device as set forth in claim 1,
wherein the first conductivity type of the semiconductor nanowire is n-type, and
wherein a doping concentration of an n-type dopant is between $10^{15}/cm^3$ and $10^{19}/cm^3$.

8. The photoelectric semiconductor nanowire device as set forth in claim 1, wherein
a portion of the semiconductor nanowire which is in contact with the first electrode and the second electrode has a higher concentration than other portions.

9. The photoelectric semiconductor nanowire device as set forth in claim 1,
wherein the semiconductor nanowire includes a first porous semiconductor segment and a second porous semiconductor segment which are spaced apart from each other, and
wherein the first porous semiconductor segment and the second porous semiconductor segment are connected to each other by the crystal semiconductor region.

10. The photoelectric semiconductor nanowire device as set forth in claim 9, further comprising:
a third electrode disposed on the crystal semiconductor segment disposed between the first porous semiconductor segment and the second porous semiconductor segment.

11. The photoelectric semiconductor nanowire device as set forth in claim 1,
wherein the semiconductor nanowire includes a first porous semiconductor segment and a second porous semiconductor segment which are spaced apart from each other,
wherein the photoelectric semiconductor nanowire device further comprising: a third electrode disposed between the first electrode and the second electrode to be adjacent to and spaced apart from the first electrode, and
the first porous semiconductor segment and the second porous semiconductor segment are not disposed between the first electrode and the third electrode.

12. The photoelectric semiconductor nanowire device as set forth in claim 1,
wherein the semiconductor nanowire further includes a semiconductor contact region directly connected to opposite ends of the semiconductor nanowire,
wherein the semiconductor contact region has a larger area than the semiconductor nanowire, and
wherein each of the first electrode and the second electrode is disposed on the semiconductor contact region.

13. The photoelectric semiconductor nanowire device as set forth in claim 1,
wherein the semiconductor nanowire is a phototransistor.

14. The photoelectric semiconductor nanowire device as set forth in claim 1,
wherein the semiconductor nanowire operates as a photodetector.

15. The photoelectric semiconductor nanowire device as set forth in claim 1, wherein
the semiconductor nanowire operates as a logic device.

16. A photoelectric semiconductor nanowire device comprising:
a semiconductor substrate;
an insulating layer disposed on the semiconductor substrate;
a semiconductor nanowire disposed on the insulating layer, doped with a dopant of a first conductivity type, and including porous semiconductor segments which include at least one porous semiconductor segment and are connected to opposite ends of the porous semiconductor segment; and a first electrode and a second electrode respectively disposed in the crystal semiconductor segments around the porous semiconductor segment to provide an electrical connection, wherein the crystal semiconductor segment includes a crystal semiconductor, wherein the porous semiconductor segment includes a porous semiconductor, and wherein the semiconductor nanowire provides a current according to intensity of an external light when the external light is irradiated to the porous semiconductor segment.

* * * * *